(12) United States Patent  
Face et al.

(10) Patent No.: US 7,692,559 B2  
(45) Date of Patent: Apr. 6, 2010

(54) SELF-POWERED SWITCH INITIATION SYSTEM

(75) Inventors: Bradbury R. Face, Norfolk, VA (US); Alfredo Vazquez Carazo, Norfolk, VA (US); Glenn F. Rogers, Jr., Hampton, VA (US); Gregory Thomas, Virginia Beach, VA (US)

(73) Assignee: Face International Corp, Norfolk, VA (US)

( * ) Notice: Subject to any disclaimer, the term of this patent is extended or adjusted under 35 U.S.C. 154(b) by 441 days.

(21) Appl. No.: 11/584,883

(22) Filed: Oct. 23, 2006

(65) Prior Publication Data

US 2007/0182594 A1 Aug. 9, 2007

Related U.S. Application Data

(63) Continuation-in-part of application No. 10/871,082, filed on Jun. 19, 2004, now Pat. No. 7,126,497.

(51) Int. Cl.  
*H03M 11/00* (2006.01)

(52) U.S. Cl. .................. 341/20; 310/311; 310/36; 310/37; 307/119

(58) Field of Classification Search .......... 341/20, 341/22; 310/330, 331, 36, 37; 307/119  
See application file for complete search history.

(56) References Cited

U.S. PATENT DOCUMENTS

| 3,632,383 | A | * | 1/1972 | Dominick et al. | 427/285 |
| 5,042,493 | A | * | 8/1991 | Saito et al. | 600/459 |
| 5,471,721 | A | * | 12/1995 | Haertling | 29/25.35 |
| 5,605,336 | A | * | 2/1997 | Gaoiran et al. | 273/445 |
| 5,632,841 | A | * | 5/1997 | Hellbaum et al. | 156/245 |
| 5,639,850 | A | * | 6/1997 | Bryant | 528/353 |
| 6,630,894 | B1 | * | 10/2003 | Boyd et al. | 341/22 |
| 6,812,594 | B2 | * | 11/2004 | Face et al. | 307/119 |

* cited by examiner

*Primary Examiner*—Albert K Wong  
*Assistant Examiner*—Hung Q Dang  
(74) *Attorney, Agent, or Firm*—David J. Bolduc

(57) ABSTRACT

A self-powered switching system using electromechanical generators generates power for activation of a latching relay. The electromechanical generators comprise electroactive elements or magnetic based microgenerators that may be mechanically actuated to generate electrical power. The associated signal generation circuitry may be coupled to a transmitter or transceiver for sending and/or receiving RF signals to/from a receiver which actuates the latching relay. Power may be stored within the circuit using rechargeable batteries for powering or supplementing power to the transmitter or transceiver.

6 Claims, 20 Drawing Sheets

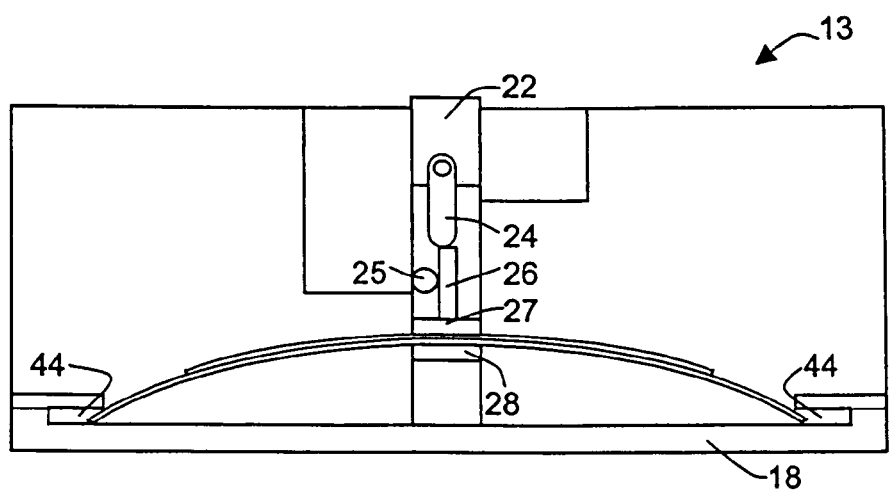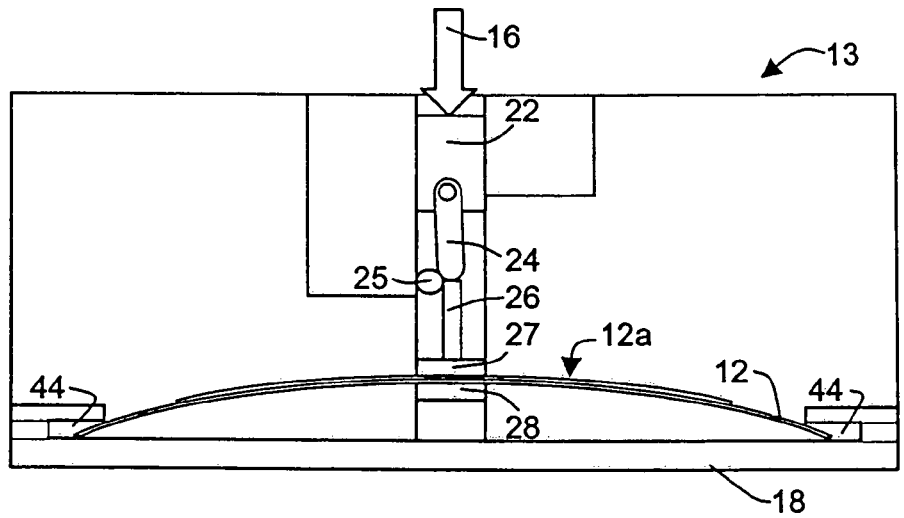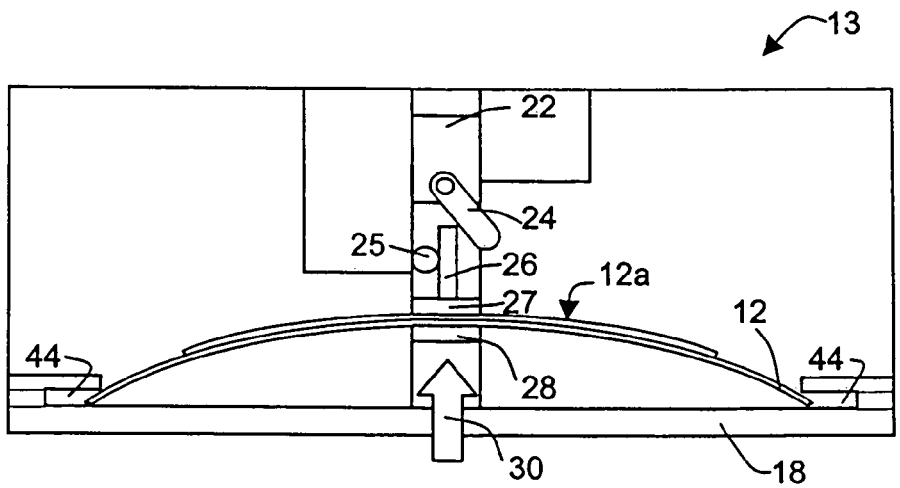

FUNCTION 1:
TOGGLE
ON / OFF
DIM / UNDIM
FAN SPEED UP / DOWN
TEMP UP/DOWN

FUNCTION 2:
TOGGLE
ON / OFF
DIM / UNDIM
FAN SPEED UP / DOWN
TEMP UP/DOWN

SELF-POWERED SWITCH INITIATION SYSTEM

This Patent Application is a Continuation-in-Part of patent application Ser. No. 10/871,082 filed Jun. 19, 2004 now U.S. Pat. No. 7,126,497.

BACKGROUND OF THE INVENTION

1. Field of the Invention

The present invention relates generally to switching devices for energizing lights, appliances and the like. More particularly, the present invention relates to a self-powered switch initiator device to generate an activation signal for a latching relay. The power is generated through an electroactive element and is sent through signal generation circuitry coupled to a transmitter for sending one or more unique and/or coded RF signals to one or more receivers that actuate the latching relay. The receivers have the ability to store a plurality of codes in order to respond to multiple transmitters and multiple transmitter functions. The invention also includes the use of one or more transceivers that are powered by the electroactive generators or by the generators in conjunction with rechargeable batteries for providing supplemental power to the RF transmitter circuit and/or transceivers.

2. Description of the Prior Art

Switches and latching relays for energizing lights, appliances and the like are well known in the prior art. Typical light switches comprise, for example, single-pole switches and three-way switches. A single-pole switch has two terminals that are hot leads for an incoming line (power source) and an outgoing line to the light. Three-way switches can control one light from two different places. Each three-way switch has three terminals: the common terminal and two traveler terminals. A typical pair of three-way switches uses two boxes each having two cables with the first box having an incoming line from a power source and an outbound line to the second box, and the second box having the incoming line from the first box and an outbound line to the light.

In each of these switching schemes it is often necessary to drill holes and mount switches and junction boxes for the outlets as well as to run cable. Drilling holes and mounting switches and junction boxes can be difficult and time consuming. Also, running electrical cable requires starting at a fixture, pulling cable through holes in the framing to each fixture in the circuit, and continuing all the way back to the service panel. Though simple in theory, getting cable to cooperate can be difficult and time consuming. Cable often kinks, tangles or binds while pulling, and needs to be straightened out somewhere along the run.

Remotely actuated switches/relays are also known in the art. Known remote actuation controllers include tabletop controllers, wireless remotes, timers, motion detectors, voice activated controllers, and computers and related software. For example, remote actuation means may include receiver modules that are plugged into a wall outlet and into which a power cord for a device may be plugged. The device can then be turned on and off by a remote controller/transmitter. Other remote actuation means include screw-in lamp receiver modules wherein the receiver module is screwed into a light socket, and then a bulb screwed into the receiver module. The light can be turned on and off and can be dimmed or brightened by a remote controller/transmitter.

Another example of one type of remote controller for the above described modules is a radio frequency (RF) base transceiver. With these controllers, a transceiver base is plugged into an outlet and can control groups of receiver modules in conjunction with a hand held wireless RF remote. RF repeaters may be used to boost the range of compatible wireless remote transmitters, switches and security system sensors by up to 150 ft. per repeater. The transceiver base is required for these wireless RF remote control systems and allows control of several lamps or appliances. Batteries are also required in the hand held wireless remote control systems.

Rather than using a hand held RF remote transmitter, remote wall transmitters may be used. These wall transmitters, which are up to ¾" thick, are affixed to a desired location with an adhesive or fastener. In conjunction with a transceiver base unit (plugged into a 110V receptacle) the remote wall transmitter may control compatible receiver/transceiver modules and their associated switches. The wireless transmitters send an RF signal to the transceiver base unit and the transceiver base unit then transmits a signal along the existing 110V wiring in the home to compatible switches or receiver modules. Each switch can be programmed with an addressable signal. Wireless transmitters also require batteries.

These remotes control devices may also control, for example, audio/video devices such as the TV, VCR, and stereo system, as well as lights and other devices using an RF to infrared (IR) base. The RF remote can control audio/video devices by sending proprietary RF commands to a converter that translates the commands to IR. IR commands are then sent to the audio/video equipment. The infrared (IR) base responds to infrared signals from the infrared remotes and then transmits equivalent commands to compatible receivers.

A problem with conventional wall switches is that extensive wiring must be run both from the switch boxes to the lights and from the switch boxes to the power source in the service panels.

Another problem with conventional wall switches is that additional wiring must be run for lights controlled by more than one switch.

Another problem with conventional wall switches is that the voltage lines are present as an input to and an output from the switch.

Another problem with conventional wall switches is the cost associated with initial installation of wire to, from and between switches.

Another problem with conventional wall switches is the cost and inconvenience associated with remodeling, relocating or rewiring existing switches.

A problem with conventional RF transmitters is that they require an external power source such as high voltage AC power or batteries.

Another problem with conventional battery-powered RF transmitters is the cost and inconvenience associated with replacement of batteries.

Another problem with conventional AC-powered RF transmitters is the difficulty when remodeling in rewiring or relocating a wall transmitter.

Another problem with conventional RF switching systems is that a pair comprising a transmitter and receiver must generally be purchased together.

Another problem with conventional RF switching systems is that transmitters may inadvertently activate incorrect receivers.

Another problem with conventional RF switching systems is that receivers may accept an activation signal from only one transmitter.

Another problem with conventional RF switching systems is that transmitters may activate only one receiver.

Another problem with conventional RF switching systems is that transmitters may be able to transmit only one signal.

Another problem with conventional RF switching systems is that transmitters may not have multiple activation signals, and that the signals are not selectable from the transmitter.

Another problem with conventional RF switching systems is that transmitters and receivers may not exchange feedback information to indicate completion of the desired action at the receiver.

Another problem with conventional RF switching systems is that there is no display to indicate completion of the desired action at the receiver.

Accordingly, it would be desirable to provide a network of switch initiators and/or latching relay devices that overcomes the aforementioned problems of the prior art.

SUMMARY OF THE INVENTION

The present invention provides a self-powered switching initiator or latching relay device using an electroactive generator or transducer. The electroactive element in the generator is capable of deforming with a high amount of bending displacement, and when deformed by a mechanical impulse generates an electric field. The electroactive transducer is used as an electromechanical converter/generator for generating an electrical signal that, with the accompanying circuitry, generates an RF signal that initiates a latching or relay mechanism. The latching or relay mechanism thereby turns electrical devices such as lights and appliances on and off or provides an intermediate or dimming signal, or initiates other functions.

The mechanical actuating means for the electroactive generator element applies a suitable mechanical impulse to the electroactive generator element in order to generate an electrical signal, such as a pulse, multiple pulses and/or waves having sufficient magnitude and duration to power and actuate downstream circuit components. A mechanism similar to a light switch, for example, may apply pressure through a toggle, snap action, paddle, plunger, plucking or ratchet mechanism. Larger or multiple electroactive generator elements may also be used to generate the electrical signal. Co-owned U.S. Pat. No. 6,630,894 entitled "Self-Powered Switching Device," which is hereby incorporated by reference, discloses a self-powered switch where the electroactive element generates an electrical pulse. Copending application Ser. No. 09/990,617 entitled "Self-Powered Trainable Switching Network," which is hereby incorporated by reference, discloses a network of switches such as that disclosed in U.S. Pat. No. 6,630,894, with the modification that the switches and receivers are capable accepting a multiplicity of coded RF signals. Copending application Ser. No. 10/188,633 entitled "Self-Powered Switch Initiation System," which is hereby incorporated by reference, discloses a network of switches such as that disclosed in U.S. Pat. No. 6,630,894, with additional modifications to the coded RF signals, multiple training topologies, and an improved mounting and actuation means, as well as circuitry to support the output electrical signal of the transducer.

In the present invention, modifications have been developed to the electroactive element, its mounting and its mechanical actuator, resulting in a modification in the character of the electrical signal produced by the transducer, as well as modifications to the electrical circuitry. The present invention describes a self-powered switch initiation system having an electroactive element and accompanying circuitry designed to work with an oscillating electrical signal. To harness the power generated by the electroactive element, the accompanying RF signal generation circuitry has also been modified to use the electrical signal most efficiently. Additionally, the use of rechargeable batteries may improve the usefulness, life and efficiency of the circuit, as well as providing supplemental power for use in a receiver, transceiver or display. Furthermore, the system may be enhanced by another power source such as a solar/light powered storage and supplementation device, such as the high efficiency light powered displays used in calculators, or by pressure and/or temperature sensitive devices for generation of supplemental power.

In one embodiment of the invention, the electroactive generator output signal powers an RF transmitter which sends an RF signal to an RF receiver which then actuates the relay. In yet another embodiment, the electromagnetic or electroactive generator output signal powers a transmitter, which sends a pulsed (coded) RF signal to an RF receiver which then actuates the relay. Digitized RF signals may be coded (as with a garage door opener) to only activate the relay that is coded with that digitized RF signal. The transmitters may be capable of developing one or more coded RF signals and the receivers likewise may be capable of receiving one or more coded RF signal. Furthermore, the transmitters may be capable of transmitting a plurality of coded signals which are selectable, using for example a selector switch, dial or scaled sliding mechanism. Furthermore, the receivers may be "trainable" to accept coded RF signals from new or multiple transmitters. In another embodiment of the invention, rechargeable batteries are used to capture some of the electrical output of the generator and apply the stored energy to circuit components. Lastly, another embodiment of the invention uses a transceiver in conjunction with the battery and transmission circuit to send and receive RF signals within the system, for example where a feedback or confirmation signal is sent from the receiver-transceiver to the transmitter-transceiver to acknowledge receipt or completion of the transmitted command function.

Accordingly, it is a primary object of the present invention to provide a switching system in which an electroactive or piezoelectric element is used to power an RF transmitter for activating an electrical device.

It is another object of the present invention to provide a device of the character described in which transmitters may be installed without necessitating additional wiring.

It is another object of the present invention to provide a device of the character described in which transmitters may be installed without cutting holes into the building structure.

It is another object of the present invention to provide a device of the character described in which transmitters do not require external electrical input such as 120 or 220 VAC or batteries.

It is another object of the present invention to provide a device of the character described incorporating an electroactive converter that generates an electrical signal of sufficient duration and magnitude to activate a radio frequency transmitter for activating a latching relay and/or switch initiator.

It is another object of the present invention to provide a device of the character described incorporating a transmitter that is capable of developing at least one coded RF signal.

It is another object of the present invention to provide a device of the character described incorporating a receiver capable of receiving at least one coded RF signal from at least one transmitter.

It is another object of the present invention to provide a device of the character described incorporating a receiver capable of "learning" to accept coded RF signals from one or more transmitters.

It is another object of the present invention to provide a device of the character described for use in actuating, operating or altering the state of lighting, appliances, controls, and security devices and other electrical and electromechanical fixtures in a building.

It is another object of the present invention to provide a device of the character described incorporating storage means for electrical energy generated at the transmitter.

It is another object of the present invention to provide a device of the character described incorporating a receiver and transmitter or a transceiver for closed loop operation and system feedback.

It is another object of the present invention to provide a device of the character described incorporating controller on the transmitter for selecting from a variety of transmissible codes.

It is another object of the present invention to provide a device of the character described incorporating a display on the transmitter for indicating the completion of a desired action by a receiver or transceiver in a closed loop system.

Further objects and advantages of the invention will become apparent from a consideration of the drawings and ensuing description thereof.

BRIEF DESCRIPTION OF THE DRAWINGS

FIG. 3 is an elevation view of an embodiment of a device for mechanical application and removal of a force to the center of an electroactive generator;

FIG. 4 is an elevation view of the device of FIG. 3 illustrating the deformation of the electroactive generator upon application of a force;

FIG. 5 is an elevation view of the device of FIG. 3 illustrating the recovery of the electroactive generator upon removal of the force by tripping of a quick-release device;

FIG. 8 is an elevation view of an alternate mounting and actuating device of the present invention for generation of an electrical signal by deflecting a flextensional piezoelectric transducer of FIG. 2a;

DESCRIPTION OF THE PREFERRED EMBODIMENT

Electroactive Generator

Figure 1:
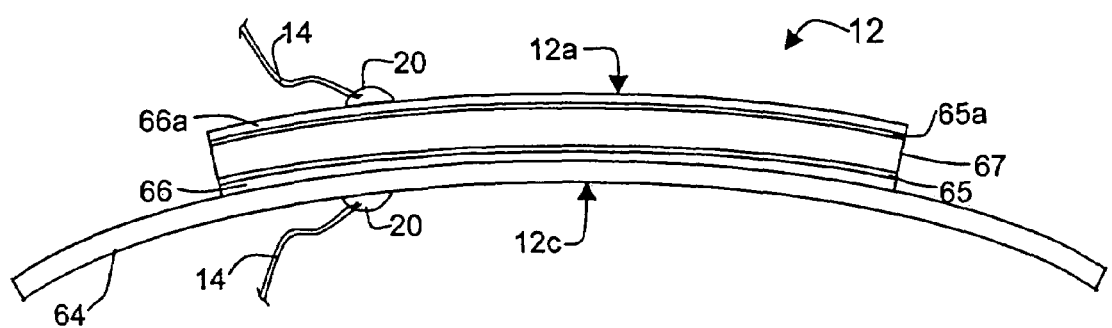
FIG. 1 is an elevation view showing the details of construction of a flextensional piezoelectric transducer used in the present invention, as an electroactive generator.

Piezoelectric and electrostrictive materials (generally called "electroactive" devices herein) develop an electric field when placed under stress or strain. The electric field developed by a piezoelectric or electrostrictive material is a function of the applied force and displacement causing the mechanical stress or strain. Conversely, electroactive devices undergo dimensional changes in an applied electric field. The dimensional change (i.e., expansion or contraction) of an electroactive element is a function of the applied electric field. Electroactive devices are commonly used as drivers, or "actuators" due to their propensity to deform under such electric fields. These electroactive devices when used as transducers or generators also have varying capacities to generate an electric field in response to a deformation caused by an applied force. In such cases they behave as electrical generators.

Electroactive devices include direct and indirect mode actuators, which typically make use of a change in the dimensions of the material to achieve a displacement, but in the present invention are preferably used as electromechanical generators. Direct mode actuators typically include a piezoelectric or electrostrictive ceramic plate (or stack of plates) sandwiched between a pair of electrodes formed on its major surfaces. The devices generally have a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent. Conversely, direct mode generator-actuators require application of a high amount of force to piezoelectrically generate a pulsed momentary electrical signal of sufficient magnitude to activate a latching relay.

Indirect mode actuators are known to exhibit greater displacement and strain than is achievable with direct mode actuators by achieving strain amplification via external structures. An example of an indirect mode actuator is a flextensional transducer. Flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater strain and displacement than can be produced by direct mode actuators.

The magnitude of achievable deflection (transverse bending) of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling (deflection normal to the plane of the electroactive element) when electrically energized. Common unimorphs can exhibit transverse bending as high as 10%, i.e., a deflection normal to the plane of the element equal to 10% of the length of the actuator. A conventional bimorph device includes an intermediate flexible metal foil sandwiched between two piezoelectric elements. Electrodes are bonded to each of the major surfaces of the ceramic elements and the metal foil is bonded to the inner two electrodes. Bimorphs exhibit more displacement than comparable unimorphs because under the applied voltage, one ceramic element will contract while the other expands. Bimorphs can exhibit transverse bending of up to 20% of the Bimorph length.

For certain applications, asymmetrically stress biased electroactive devices have been proposed in order to increase the transverse bending of the electroactive generator, and therefore increase the electrical output in the electroactive material. In such devices, (which include, for example, "Rainbow" actuators (as disclosed in U.S. Pat. No. 5,471,721), and other flextensional actuators) the asymmetric stress biasing produces a curved structure, typically having two major surfaces, one of which is concave and the other which is convex.

Thus, various constructions of flextensional piezoelectric and ferroelectric generators may be used including: indirect mode actuators (such as "moonies" and CYMBAL); bending actuators (such as unimorph, bimorph, multimorph or monomorph devices); prestressed actuators (such as "THUNDER" and "rainbow" actuators as disclosed in U.S. Pat. No. 5,471, 721); and multilayer actuators such as stacked actuators; and polymer piezofilms such as PVDF. Many other electromechanical devices exist and are contemplated to function similarly to power a transmitter, receiver and/or transceiver circuit in the present invention.

Referring to FIG. 1: The electroactive generator preferably comprises a prestressed unimorph device called "THUNDER", which has improved displacement and load capabilities, as disclosed in U.S. Pat. No. 5,632,841. THUNDER (which is an acronym for THin layer composite UNimorph ferroelectric Driver and sEnsoR), is a unimorph device in which a pre-stress layer is bonded to a thin piezoelectric ceramic wafer at high temperature. During the cooling down of the composite structure, asymmetrical stress biases the ceramic wafer due to the difference in thermal contraction rates of the pre-stress layer and the ceramic layer. A THUNDER element comprises a piezoelectric ceramic layer bonded with an adhesive (preferably an imide) to a metal (preferably stainless steel) substrate. The substrate, ceramic and adhesive are heated until the adhesive melts and they are subsequently cooled. During cooling as the adhesive solidifies the adhesive and substrate thermally contracts more than the ceramic, which compressively stresses the ceramic. Using a single substrate, or two substrates with differing thermal and mechanical characteristics, the actuator assumes its normally arcuate shape. The transducer or electroactive generator may also be normally flat rather than arcuate, by applying equal amounts of prestress to each side of the piezoelectric element, as dictated by the thermal and mechanical characteristics of the substrates bonded to each face of the piezo-element.

The THUNDER element 12 is as a composite structure, the construction of which is illustrated in FIG. 1. Each THUNDER element 12 is constructed with an electroactive member preferably comprising a piezoelectric ceramic layer 67 of PZT which is electroplated 65 and 65a on its two opposing faces. A pre-stress layer 64, preferably comprising spring steel, stainless steel, beryllium alloy, aluminum or other flexible substrate (such as metal, fiberglass, carbon fiber, KEVLAR™, composites or plastic), is adhered to the electroplated 65 surface on one side of the ceramic layer 67 by a first adhesive layer 66. In the simplest embodiment, the adhesive layer 66 acts as a prestress layer. The first adhesive layer 66 is preferably LaRC™-SI material, as developed by NASA-Langley Research Center and disclosed in U.S. Pat. No. 5,639, 850. A second adhesive layer 66a, also preferably comprising LaRC-SI material, is adhered to the opposite side of the ceramic layer 67. During manufacture of the THUNDER element 12 the ceramic layer 67, the adhesive layer(s) 66 and 66a and the pre-stress layer 64 are simultaneously heated to a temperature above the melting point of the adhesive material. In practice the various layers composing the THUNDER element (namely the ceramic layer 67, the adhesive layers 66 and 66a and the pre-stress layer 64) are typically placed inside of an autoclave, heated platen press or a convection oven as a composite structure, and slowly heated under pressure by convection until all the layers of the structure reach a temperature which is above the melting point of the adhesive 66 material but below the Curie temperature of the ceramic layer 67. Because the composite structure is typically convectively heated at a slow rate, all of the layers tend to be at approximately the same temperature. In any event, because an adhesive layer 66 is typically located between two other layers (i.e. between the ceramic layer 67 and the pre-stress layer 64), the ceramic layer 67 and the pre-stress layer 64 are usually very close to the same temperature and are at least as hot as the adhesive layers 66 and 66a during the heating step of the process. The THUNDER element 12 is then allowed to cool.

Figure 2:
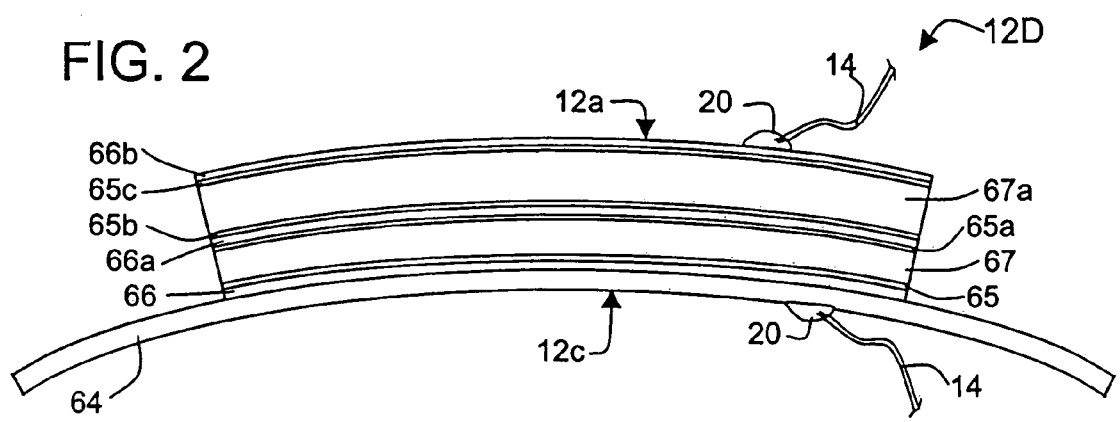
FIG. 2 is an elevation view showing the details of construction of an alternate multi-layer flextensional piezoelectric generator used in a modification of the present invention.

During the cooling step of the process (i.e. after the adhesive layers 66 and 66a have re-solidified) the ceramic layer 67 becomes compressively stressed by the adhesive layers 66 and 66a and pre-stress layer 64 due to the higher coefficient of thermal contraction of the materials of the adhesive layers 66 and 66a and the pre-stress layer 64 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66a) on the other side of the ceramic layer 67, the ceramic layer deforms in an arcuate shape having a normally convex face 12a and a normally concave face 12c, as illustrated in FIGS. 1 and 2.

Figure 1A:
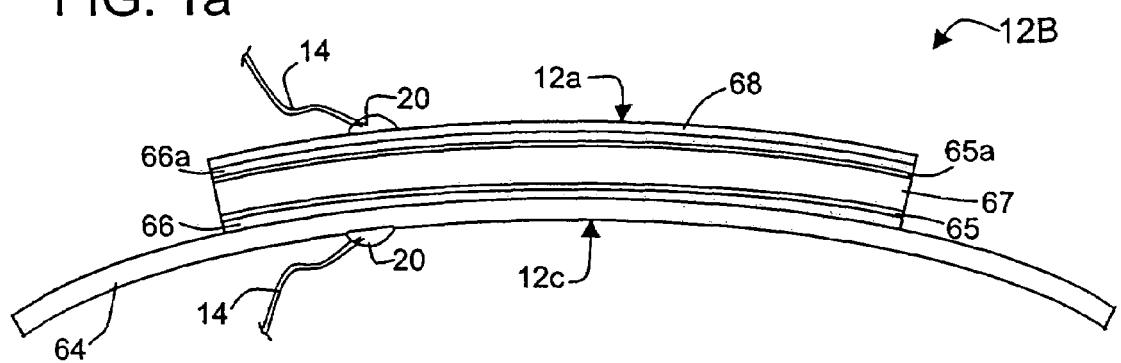
FIG. 1a is an elevation view showing the details of construction of the flextensional piezoelectric generator of FIG. 1 having an additional prestress layer.

Referring to FIG. 1a: One or more additional pre-stressing layer(s) may be similarly adhered to either or both sides of the ceramic layer 67 in order, for example, to increase the stress in the ceramic layer 67 or to strengthen the THUNDER element 12B. In a preferred embodiment of the invention, a second prestress layer 68 is placed on the concave face 12a of the THUNDER element 12B having the second adhesive layer 66a and is similarly heated and cooled. Preferably the second prestress layer 68 comprises a layer of conductive metal. More preferably the second prestress layer 68 comprises a thin foil (relatively thinner than the first prestress layer 64) comprising aluminum or other conductive metal. During the cooling step of the process (i.e. after the adhesive layers 66 and 66a have re-solidified) the ceramic layer 67 similarly becomes compressively stressed by the adhesive layers 66 and 66a and pre-stress layers 64 and 68 due to the higher coefficient of thermal contraction of the materials of the adhesive layers 66 and 66a and the pre-stress layers 64 and 68 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66a and the second prestress layer 68) on the other side of the ceramic layer 67, the ceramic layer 67 deforms into an arcuate shape having a normally convex face 12a and a normally concave face 12c, as illustrated in FIG. 1a.

Alternately, the second prestress layer 68 may comprise the same material as is used in the first prestress layer 64, or a material with substantially the same mechanical strain characteristics. Using two prestress layers 64, 68 having similar mechanical strain characteristics ensures that, upon cooling, the thermal contraction of the laminate materials (e.g. the first pre-stress layer 64 and the first adhesive layer 66,) on one side of the ceramic layer 67 is substantially equal to the thermal contraction of the laminate materials (e.g. the second adhesive layer 66a and the second prestress layer 68) on the other side of the ceramic layer 67, and the ceramic layer 67 and the transducer 12 remain substantially flat, but still under a compressive stress.

Alternatively, the substrate comprising a separate prestress layer 64 may be eliminated and the adhesive layers 66 and 66a alone or in conjunction may apply the prestress to the ceramic layer 67. Alternatively, only the prestress layer(s) 64 and 68 and the adhesive layer(s) 66 and 66a may be heated and bonded to a ceramic layer 67, while the ceramic layer 67 is at a lower temperature, in order to induce greater compressive stress into the ceramic layer 67 when cooling the transducer 12.

Referring now to FIG. 2: Yet another alternate THUNDER generator element 12D includes a composite piezoelectric ceramic layer 69 that comprises multiple thin layers 69a and 69b of PZT which are bonded to each other or cofired together. In the mechanically bonded embodiment of FIG. 2, two layers 69a and 69b, or more (not shown) my be used in this composite structure 12D. Each layer 69a and 69b comprises a thin layer of piezoelectric material, with a thickness preferably on the order of about 1 mil. Each thin layer 69a and 69b is electroplated 65 and 65a, and 65b and 65c on each major face respectively. The individual layers 69a and 69b are then bonded to each other with an adhesive layer 66b, using an adhesive such as LaRC-SI. Alternatively, and most preferably, the thin layers 69a and 69b may be bonded to each other by cofiring the thin sheets of piezoelectric material together. As few as two layers 69a and 69b, but preferably at least four thin sheets of piezoelectric material may be bonded/cofired together. The composite piezoelectric ceramic layer 69 may then be bonded to prestress layer(s) 64 with the adhesive layer(s) 66 and 66a, and heated and cooled as described above to make a modified THUNDER transducer 12D. By having multiple thinner layers 69a and 69b of piezoelectric material in a modified transducer 12D, the composite ceramic layer generates a lower voltage and higher current as compared to the high voltage and low current generated by a THUNDER transducer 12 having only a single thicker ceramic layer 67. Additionally, a second prestress layer may be used comprise the same material as is used in the first prestress layer 64, or a material with substantially the same mechanical strain characteristics as described above, so that the composite piezoelectric ceramic layer 69 and the transducer 12D remain substantially flat, but still under a compressive stress.

Referring now to FIG. 2b: Yet another alternate THUNDER generator element 12E includes another composite piezoelectric ceramic layer 169 that comprises multiple thin layers 169a-f of PZT which are cofired together. In the cofired embodiment of FIG. 2b, two or more layers 169a-f, and preferably at least four layers, are used in this composite structure 12E. Each layer 169a-f comprises a thin layer of piezoelectric material, with a thickness preferably on the order of about 1 mil, which are manufactured using thin tape casting for example. Each thin layer 169a-f placed adjacent each other with electrode material between each successive layer. The electrode material may include metallizations, screen printed, electro-deposited, sputtered, and/or vapor deposited conductive materials. The individual layers 169a-f and internal electrodes are then bonded to each other by cofiring the composite multi-layer ceramic element 169. The individual layers 169a-f are then poled in alternating directions in the thickness direction. This is accomplished by connecting high voltage electrical connections to the electrodes, wherein positive connections are connected to alternate electrodes, and ground connections are connected to the remaining internal electrodes. This provides an alternating up-down polarization of the layers 169a-f in the thickness direction. This allows all the individual ceramic layers 169a-f to be connected in parallel. The composite piezoelectric ceramic layer 169 may then be bonded to prestress layer(s) 64 with the adhesive layer(s) 66 and 66a, and heated and cooled as described above to make a modified THUNDER transducer 12D.

Figure 2A:
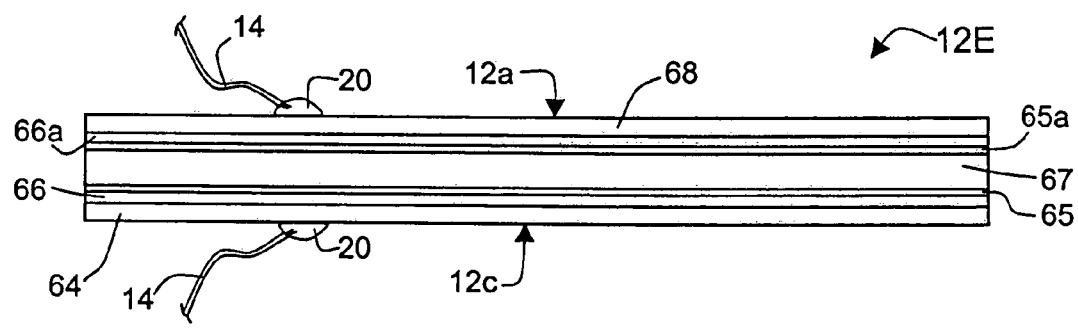
FIG. 2a is an elevation view showing the details of construction of the flextensional piezoelectric generator of FIG. 1a with a flat rather than arcuate profile.

Referring again to FIGS. 2, 2a and 2b: By having multiple thinner layers 69a and 69b (or 169a-f) of piezoelectric material in a modified transducer 12D-F, the composite ceramic layer generates a lower voltage and higher current as compared to the high voltage and low current generated by a THUNDER transducer 12 having only a single thicker ceramic layer 67. This is because with multiple thin paralleled layers the output capacitance is increased, which decreases the output impedance, which pr9ovides better impedance matching with the electronic circuitry connected to the THUNDER element. Also, since the individual layers of the composite element are th8inner, the output voltage can be reduced to reach a voltage which is closer to the operating voltage of the electronic circuitry (in a range of 3.3V-10.0V) which provides less waste in the regulation of the voltage and better matching to the desired operating voltages of the circuit. Thus the multilayer element (bonded or cofired) improves impedance matching with the connected electronic circuitry and improves the efficiency of the mechanical to electrical conversion of the element.

A flexible insulator may be used to coat the convex face 12a of the transducer 12. This insulative coating helps prevent unintentional discharge of the piezoelectric element through inadvertent contact with another conductor, liquid or human contact. The coating also makes the ceramic element more durable and resistant to cracking or damage from impact. Since LaRC-SI is a dielectric, the adhesive layer 67a on the convex face 12a of the transducer 12 may act as the insulative layer. Alternately, the insulative layer may comprise a plastic, TEFLON or other durable coating.

Electrical energy may be recovered from or introduced to the generator element 12 (or 12D) by a pair of electrical wires 14. Each electrical wire 14 is attached at one end to opposite sides of the generator element 12. The wires 14 may be connected directly to the electroplated 65 and 65a faces of the ceramic layer 67, or they may alternatively be connected to the pre-stress layer(s) 64 and or 68. The wires 14 are connected using, for example, conductive adhesive, or solder 20, but most preferably a conductive tape, such as a copper foil tape adhesively placed on the faces of the electroactive generator element, thus avoiding the soldering or gluing of the conductor. As discussed above, the pre-stress layer 64 is preferably adhered to the ceramic layer 67 by LaRC-SI material, which is a dielectric. When the wires 14 are connected to the pre-stress layer(s) 64 and/or 68, it is desirable to roughen a face of the pre-stress layer 68, so that the pre-stress layer 68 intermittently penetrates the respective adhesive layers 66 and 66a, and makes electrical contact with the respective electroplated 65 and 65a faces of the ceramic layer 67. Alternatively, the Larc-SI adhesive layer 66 may have a conductive material, such as Nickel or aluminum particles, used as a filler in the adhesive and to maintain electrical contact between the prestress layer and the electroplated faces of the ceramic layer(s). The opposite end of each electrical wire 14 is preferably connected to an electric pulse modification circuit 10.

Prestressed flextensional transducers 12 are desirable due to their durability and their relatively large displacement, and concomitant relatively high voltage that such transducers are capable of developing when deflected by an external force. The present invention however may be practiced with any electroactive element having the properties and characteristics herein described, i.e., the ability to generate a voltage in response to a deformation of the device. For example, the invention may be practiced using magnetostrictive or ferroelectric devices. The transducers also need not be normally arcuate, but may also include transducers that are normally flat, and may further include stacked piezoelectric elements.

In operation, as shown in FIG. 4, when a force indicated by arrow 16 is applied to the convex face 12a of the transducer 12, the force deforms the electroactive layer 67. The force may be applied to the transducer 12 by any appropriate means such as by application of manual pressure directly to the transducer, or by other mechanical means. Preferably, the force is applied by a mechanical switch (e.g., a plunger, striker, toggle or roller switch) capable of developing a mechanical impulse for application to and removal from the transducer 12. The mechanical impulse (or removal thereof) is of sufficient force to cause the transducer 12 to deform quickly and accelerate over a distance (approximately 10 mm), and oscillate between deflected positions about the undeflected position, which generates an electrical signal of sufficient magnitude to activate downstream circuit components for operation of an electromechanical latching relay, or generation of an RF transmission to activate a receiver which operates the electromechanical latching relay.

Referring to FIGS. 3, 4 and 5: An illustration of prior means for generating an electrical pulse by application of mechanical force comprises a switch plate 18 and a plunger assembly 13. The two ends of the piezoelectric transducer 12 are each pivotably held in place within a recess 44 of a switch plate 18. The switch plate 18 is the same shape as the transducer 12 contained therein, preferably rectangular. Alternatively, a circular transducer 12 is mounted in a circular recess of a circular switch plate. The recess(es) 44 in the switch plate 18 hold the transducer 12 in place in its relaxed, i.e., undeformed state. The recesses 44 are also sufficiently deep to fully receive the ends or edges of the transducer 12 in its fully deformed, i.e., flat state. The plunger assembly comprises a push button 22 pivotably connected to a hinged quick-release mechanism 24. The opposite end of the quick-release mechanism 24 contacts shaft 26 connected to a pair of plates 27 and 28 which are clamped on both sides of the transducer 12. A release cog 25 is located along the path of the quick-release mechanism 24.

In operation, when the push button 22 is depressed in the direction of arrow 16, the quick-release mechanism 24 pushes down on the shaft 26 and plates 27 and 28 and deforms the transducer 12. When the quick-release mechanism 24 reaches the release cog 25, the quick-release mechanism 24 pivots on its hinge and releases the downward pressure from the shaft 26, plates 27 and 28 and transducer 12. The transducer 12, on account of the restoring force of the substrate of the prestress layer 64, returns quickly to its undeformed state in the direction of arrow 30 as in FIG. 5.

As previously mentioned, the applied force causes the piezoelectric transducer 12 to deform. By virtue of the piezoelectric effect, the deformation of the piezoelectric element 67 generates an instantaneous voltage between the faces 12a and 12c of the transducer 12, which produces a pulse of electrical energy. Furthermore, when the force is removed from the piezoelectric transducer 12, the transducer 12 recovers its original arcuate shape. This is because the bending of the substrate (and attached layers) stores mechanical (spring) energy which is released upon removal of the force. Additionally, the substrate or prestress layers 64 and 68 to which the ceramic 67 is bonded exert a compressive force on the ceramic 67, and the transducer 12 thus has an additional restoring force that causes the transducer 12 to return to its undeformed neutral state. On the recovery stroke of the transducer 12, the ceramic 67 returns to its undeformed state and thereby produces another electrical pulse of opposite polarity. The downward (applied) or upward (recovery) strokes cause a force over a distance that is of sufficient magnitude to create the desired electrical pulse. The duration of the recovery stroke, and therefore the duration of the pulse produced, is preferably in the range of 50-100 milliseconds, depending on the mechanical properties of the transducer, including its natural frequency of vibration.

Figure 6:
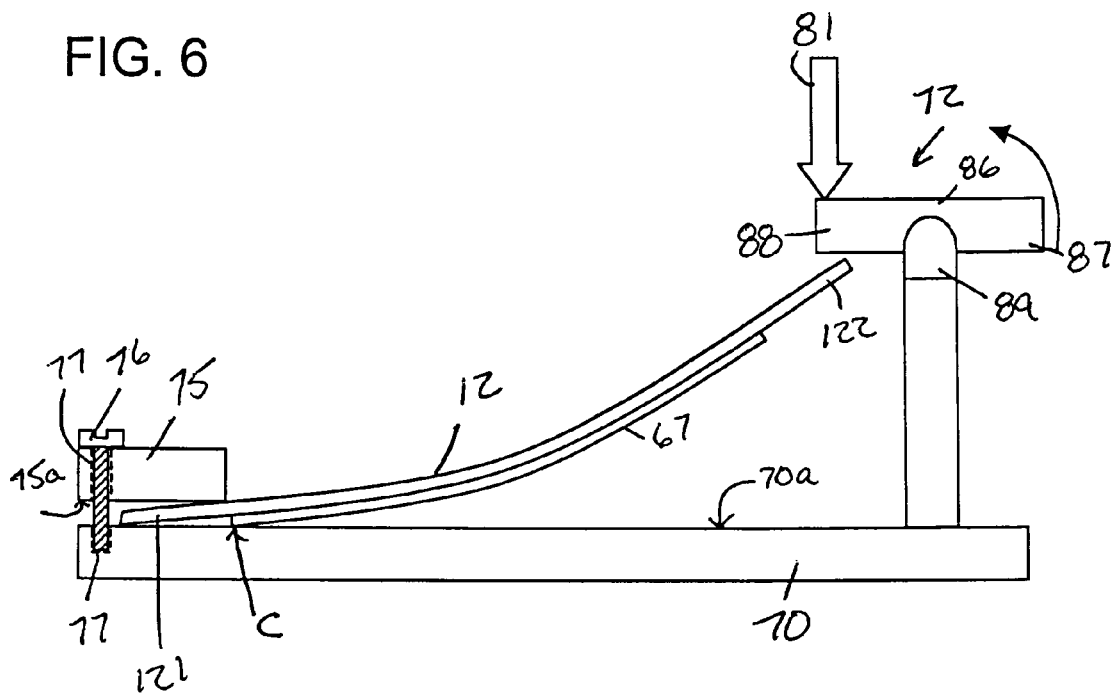
FIG. 6 is an elevation view of the actuating device of the present invention for generation of an electrical signal by deflecting a flextensional piezoelectric transducer.

Referring to FIG. 6: In the preferred embodiment of the invention, the transducer 12 is clamped at one end 121 and the mechanical impulse is applied to the edge on the free end 122, i.e., at the end opposite to the clamped end 121 of the transducer 12. By applying the force to the edge on the free end 122 of the transducer 12 and releasing it, the actuator oscillates between the release position, to another position past the undeformed position, and then dampedly oscillates between the deformed positions returning to the undeformed position, by virtue of the substrates (spring steel) restoring force. Therefore, the electrical pulse that is generated upon removal of the force is an oscillating wave (rather than a single pulse as with the prior actuating means disclosed above).

Referring again to FIG. 6: FIG. 6 illustrates one embodiment of a device for generating an oscillating electrical signal by application of mechanical force to an end 122 of the transducer 12. This device comprises a transducer 12 mounted between a base plate 70 and a clamping member 75 as well as a deflector assembly 72. The base plate 70 is preferably of substantially the same shape (in plan view) as the transducer 12 attached thereon, and most preferably rectangular. One end 121 of the piezoelectric transducer 12 is held in place between the clamping member 75 and the upper surface 70a of a base plate 70, preferably on one end thereof. The clamping member 75 comprises a plate or block having a lower surface 75a designed to mate with the upper surface 70a of the base plate 70 with the transducer 12 therebetween. The device also has means for urging 76 the mating surface 75a of the clamping block towards the upper surface 70a of the base plate 70. This allows the lower surface 75a of the clamping plate 75 to be substantially rigidly coupled to the upper surface 70a of the base plate 70, preferably towards one side of the switch plate 70. The means for urging 76 together the mating surfaces 70a and 75a of the base plate 70 and clamping plate 75 may comprise screws, clamping jaws or springs or the like. Most preferably the urging means 76 comprises at least one screw 76 passing through the clamping member 75 and into a screw hole 77 in the upper surface 70a of the base plate 70.

One end 121 of a transducer 12 is placed between the mating surfaces 70a and 75a of the base and clamping plates 70 and 75. The mating surfaces 70a and 75a are then urged towards each other with the screw 76 to rigidly hold the end 121 of the transducer 12 in place between the base and clamping plates 70 and 75 with the opposite end 122 of the transducer 12 free to be moved by a mechanical impulse applied manually or preferably by a deflector assembly 72. The transducer 12 may further be aligned and securely retained between the base plate 70 and clamping plate 75 by means of one or more pins (not shown) on the base plate 70 and/or clamping plate 75 and holes (not shown) in the end 121 of the transducer 12.

Figure 7:
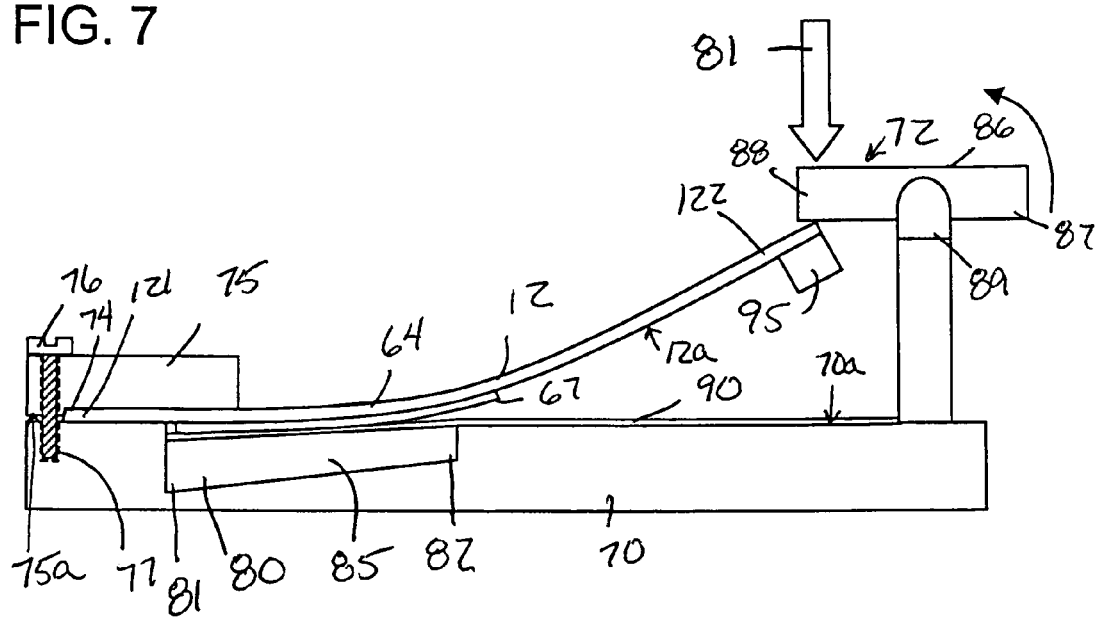
FIG. 7 is an elevation view of the preferred mounting and actuating device of the present invention for generation of an electrical signal by deflecting a flextensional piezoelectric transducer.

Referring now to FIG. 7: In the preferred embodiment of the invention the surfaces 70a and 75a of the base and clamping plate 70 and 75 are designed to best distribute pressure evenly along the end 121 of the transducer 12 therebetween. To this end the upper surface 70a of the base plate 70 contacting the end 121 of the transducer 12 is preferably substantially flat and lower surface 75a of the clamping member 75 preferably has a recess 74 therein which accommodates insertion of the transducer end 121 therein. Preferably the depth of the recess 74 is equal to half the thickness of the transducer substrate 64, but may be as deep as the substrate thickness. Thus, the end 121 of the transducer 12 may be placed between the recess 74 and the upper surface 70a of the base plate 70 and secured therebetween by the screw 76. Alternatively, either or both of the mating surfaces 70a and 75a of the base and clamping plates 70 and 75 may have a recess therein to accommodate insertion and retention of the end 121 of the transducer 12 therebetween. The portion of the bottom surface 75a of the clamping member 75 beyond the recess 74 has no contact with the transducer 12, and is that portion through which the screw 76 passes. This portion of the bottom surface 75a may contact the upper surface 70a of the base plate 70, but most preferably there is a small gap (equal to the difference of the substrate thickness and the recess depth) between the lower surface 75a of the clamping member 75 and the top surface 70a of the base plate 70 when the transducer 12 is inserted therebetween. In yet another embodiment of the invention, the mating surfaces 70a and 75a of the base and clamping plates 70 and 75 may be adhesively bonded together (rather than screwed) with the end 121 of the transducer 12 sandwiched therebetween. In yet another alternative embodiment of the device, the clamping member 75 and base plate 70 may comprise a single molded structure having a central slot into which may be inserted one end 121 of the transducer 12.

The clamping assembly 75 holds the transducer 12 in place in its relaxed, i.e., undeformed state above the base plate 70 with the free end 122 of the transducer 12 in close proximity to a deflector 72 assembly. More specifically, the transducer 12 is preferably clamped between the mating surfaces 70a and 75a of the base and clamping plates 70 and 75 with the convex face 12a of the transducer 12 facing the base plate 70. Since the transducer 12 in its relaxed state is arcuate, the convex face 12a of the transducer 12 curves away from the upper surface 70a of the base plate 70 while approaching the free end 122 of the transducer 12. Mechanical force may then be applied to the free end 122 of the transducer 12 in order to deform the electroactive element 67 to develop an electrical signal.

Because of the composite, multi-layer construction of the transducer 12 it is important to ensure that the clamping member 75 not only holds the transducer 12 rigidly in place, but also that the transducer 12 is not damaged by the clamping member 75. In other words, the transducer 12, and more specifically the ceramic layer 67, should not be damaged by the clamping action of the clamping member 75 in a static mode, but especially in the dynamic state when applying a mechanical impulse to the transducer 12 with the plunger 72. For example, referring to FIG. 6, when a mechanical impulse is applied to the transducer 12 in the direction of arrow 81, the bottom corner of the ceramic (at point C) contacts the base plate 70 and is further pushed into the base plate, which may crack or otherwise damage the ceramic layer 67.

Referring again to FIG. 7: It has been found that the tolerances between the mating surfaces 75a and 70a of the clamping and base plates 75 and 70 are very narrow. It has also been found that application of a downward force (as indicated by arrow 81) to the free end 122 of the transducer 12 would cause the ceramic element 67 of the transducer 12 to contact the upper surface 70a of the base plate 70, thereby making more likely damage to the ceramic 67. Therefore, in the preferred embodiment of the invention, the base plate 70 has a recessed area 80 in its upper surface 70a which not only protects the electroactive element 67 from damage but also provides electrical contact to the convex face 12a of the transducer 12 so that the electrical signal developed by the transducer 12 may be applied to downstream circuit elements.

As can be seen in FIG. 7, one end 121 of the transducer 12 is placed between the surfaces 75a and 70a of the clamping and base plates 75 and 70 such that only the substrate 64 contacts both surface 75a and 70a. The clamping plate 75 preferably contacts the concave surface 12b of the transducer 12 along the substrate 64 up to approximately the edge of the ceramic layer 67 on the opposite face 12a of the transducer 12. The clamping member may however extend along the convex face 12c further than the edge C of the ceramic layer 67 in order to apply greater or more even pressure to the transducer 12 surfaces 12a and 12c between the clamping member 75 and base plate 70. The ceramic layer 67 which extends above the surface of the substrate 64 on the convex face 12a extends into the recessed area 80 of the switch plate 70. This prevents the ceramic layer 67 from contacting the upper surface 70a of the base plate 70, thereby reducing potential for damage to the ceramic layer 67.

The recess 80 is designed not only to prevent damage to the ceramic layer 67, but also to provide a surface along which electrical contact can be maintained with the electrode 68 on the convex face of the transducer 12. The recess 80 extends into the base plate 70 and has a variable depth, preferably being angled to accommodate the angle at which the convex face 12a of the transducer 12 rises from the recess 80 and above the top surface 70a of the base plate 70. More specifically, the recess 80 preferably has a deep end 81 and a shallow end 82 with its maximum depth at the deep end 81 beneath the clamping member 75 and substrate 12 just before where the ceramic layer 67 extends into the recess 80 at point C. The recess 80 then becomes shallower in the direction approaching the free end 122 of the transducer 12 until it reaches its minimum depth at the shallow end 82.

The recess 80 preferably contains a layer of compliant material 85 (preferably rubber, but alternately cork, urethane, silicone, felt or the like) along its lower surface which helps prevent the ceramic layer 67 from being damaged when the transducer 12 is deformed and the lower edge C of the ceramic layer 67 is pushed into the recess 80. Preferably the compliant layer 85 is of substantially uniform thickness along its length, the thickness of the compliant layer 85 being substantially equal to the depth of the recess 80 at the shallow end 82. The length of the compliant layer 85 is preferably slightly shorter than the length of the recess 80 to accommodate the deformation of the compliant layer 85 when the transducer 12 is pushed into the recess and compliant layer 85.

The compliant layer 85 preferably has a flexible electrode layer 90 overlying it to facilitate electrical contact with the aluminum layer 68 on the ceramic layer 67 on the convex face 12a of the transducer 12. More preferably, the electrode layer 90 comprises a layer of copper overlaying a layer of KAPTON film, as manufactured by E.I. du Pont de Nemours and Company, bonded to the compliant layer 85 with a layer of adhesive, preferably CIBA adhesive. The electrode layer 90 preferably extends completely across the compliant layer 85 from the deep end 81 to the shallow end 82 of the recess 80 and may continue as far as desired beyond the recess 80 along the top surface 70a of the base plate 70.

In the preferred embodiment of the invention, the end 121 of the transducer 12 is not only secured between the clamping plate 75 and the base plate 70, but the second prestress layer 68 covering the ceramic layer 67 of the transducer 12 is in constant contact with the electrode layer 90 in the recess 80 at all times, regardless of the position of the transducer 12 in its complete range of motion. To this end, the depth of the recess 80 (from the top surface 70a to the electrode 90) is at least equal to a preferably slightly less than the thickness of the laminate layers (adhesive layers 66, ceramic layer 67 and prestress layer 68) extending into the recess 80. The electrode layer is preferably adhered to either or both the aluminum layer 68 and the compliant layer 85, with a suitable adhesive, including for example, conductive adhesives.

An assembly was built having the following illustrative dimensions. The transducer 12 comprised a 1.59 by 1.79 inch spring steel substrate that was 8 mils thick. A 1-1.5 mil thick layer of adhesive having a nickel dust filler in a 1.51 inch square was placed one end of the substrate 0.02 inch from three sides of the substrate (leaving a 0.25 inch tab on one end 121 of the transducer 12). An 8-mil thick layer of PZT-5A type piezoelectric material in a 1.5 inch square was centered on the adhesive layer. A 1-mil thick layer of adhesive (with no metal filler) was placed in a 1.47 inch square centered on the PZT layer. Finally, a 1-mil thick layer of aluminum in a 1.46 inch square was centered on the adhesive layer. The tab 121 of the transducer 12 was placed in a recess in a clamping block 76 having a length of 0.375 inch and a depth of 4 mils. The base plate 70 had a 0.26 in long recess 80 where the deep end 81 of the recess had a depth of 20 mils and tapered evenly to a depth of 15 mils at the shallow end 82 of the recess 80. A rubber compliant layer 85 having a thickness of 15 mils and a length of 0.24 inches was placed in the recess 80. An electrode layer of 1 mil copper foil overlying 1 mil KAPTON tape was adhered to the rubber layer and extended beyond the recess 1.115 inches. The clamping member 75 was secured to the base plate 70 with a screw 76 and the aluminum second prestress layer of the transducer 12 contacted the electrode 90 in the recess 80 substantially tangentially (nearly parallel) to the angle the transducer 12 thereby maximizing the surface area of the electrical contact between the two.

As shown in FIG. 7, in an alternate embodiment of the invention, a weight 95 may be attached to the free end 122 of the transducer 12. The addition of the mass 95 to the free end 122 of the transducer 12, decreases the amount of damping of the oscillation and thereby increases the duration of oscillation of the transducer 12 when it was deflected and released. By having a longer duration and higher overall amplitude oscillation, the transducer 12 is capable of developing more electrical energy from its oscillation than an transducer 12 having no additional mass at its free end 122.

Figure 8:
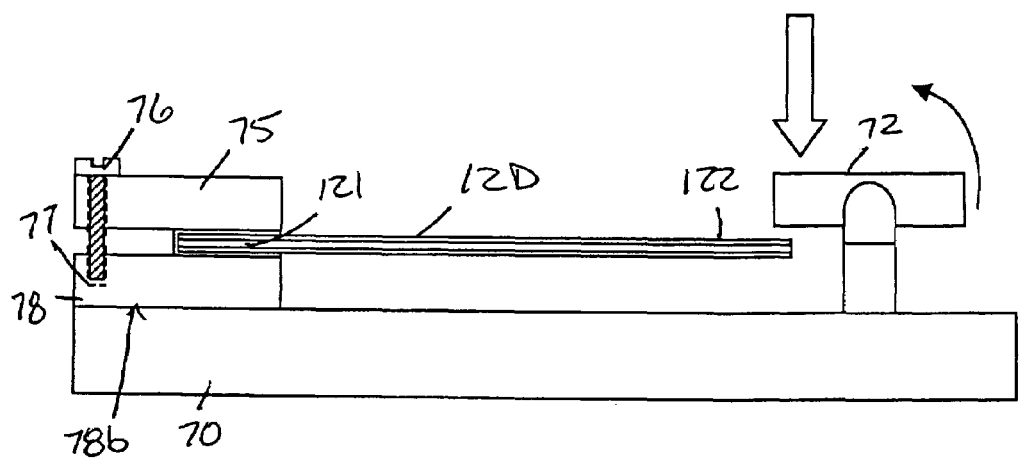

As shown in FIG. 8, in an alternate embodiment of the invention, an transducer 12, 12B, 12D may be mounted in a cantilever fashion. In FIG. 8, the transducer 12D pictured is that of FIG. 2A, but other transducers 12 or 12B may be similarly mounted. This mount also includes a base plate 70 and clamping plates 75, 78 for retaining the clamped end 121 of the transducer 12 therebetween, as well as deflector 72 mounted to the base plate 70 in proximity to the free end 122 of the transducer 12. The lower clamping plate 78 is rigidly connected to the base plate 70 at its lower surface 78b, and holds the transducer 12 on its top surface 78a above the top surface of the base plate 70, which allows the deflector 72 to deform the free end 122 of the transducer 12 up to the distance equal to the lower clamping plate's 78 thickness. The upper clamping plate 75 and lower clamping plate 78 hold the free end 121 of the transducer 12 therebetween through use of urging means, including the screw 76 and screw hole 77 pictured. Although the preferred embodiment of the invention uses a screw 76, other means for urging 76 the plates 75, 78 together may be used, such as clamping jaws, springs, clips, adhesives and the like.

Figure 9A:
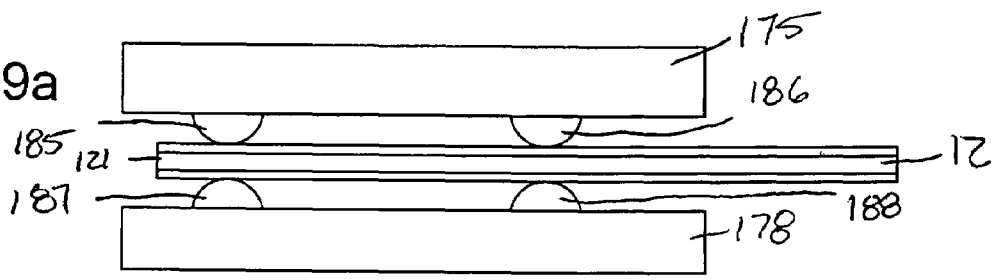
FIGS. 9a-9c show an alternate clamping mechanism for retention of an end of a flextensional piezoelectric transducer in undeflected and deflected states.
Figure 9B:
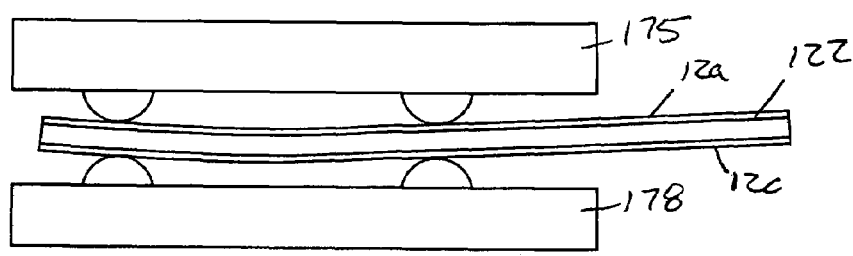
Figure 9C:
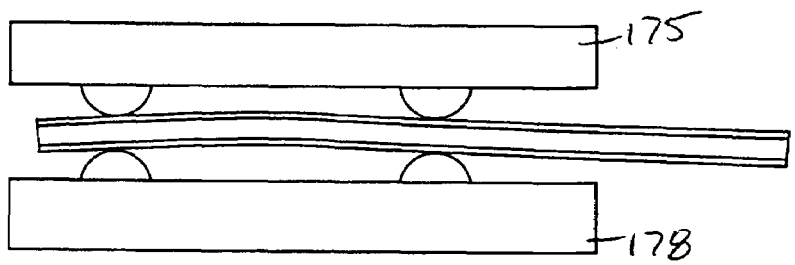

Referring now to FIGS. 9a-9c: An alternate means for clamping the transducer 12 is shown, wherein each of the clamping plates 175, 177 has rounded projections thereon, for retaining the transducer 12, yet allowing some bending or the transducer 12 between the plates 175, 177, in order to distribute and reduce point bending forces on the retained portion 121 of the transducer 12. The clamping plates 175, 177 are urged together, preferably using one or more screws or bolts (not shown). In the preferred embodiment of the clamping plates 175, 177, the upper clamping plate 175 has two rounded projections 185, 186 thereon and the lower clamping plate 177 also has two rounded projections 187, 188 thereon. Each projection 185-188 is preferably shaped substantially like a half cylinder with the radius of the cylinder extending from the mating faces of the clamping plates 175, 177, and in the height dimension of the half cylinder are substantially perpendicular to the direction along which the transducer 12 extends from the plates 175, 177. The projections are constructed of a rigid, durable material such as metal or hard plastic. Each of the projections 185, 186 and 187, 188 are parallel to each other and equidistant, i.e., projections 185 and 186 are parallel and separated by the same distance as parallel projection 187 and 188. This facilitates placing the end 121 of the transducer 12 between the projections 185-188 so that the end 121 is retained between the plates 175, 177 along two parallel lines corresponding to the projections 185, 187 and 186, 188 on either side of the respective lines. The projections may alternately comprise multiple hemispherical projections, wherein each projection 185-188 comprises two or more hemispherical projections situated along the same axis as the semi-cylindrical projections 185-188.

As can be seen in FIGS. 9a-9c, when the free end 122 of transducer 12 is deflected as shown by arrows 191 and 192, the end 121 of the transducer 12 between the projections 185-188 is allowed to bend between and around the projections 185-188. Furthermore, the rounded shape of the projections 185-188 reduces point bending stresses in the transducer 12. This is because as the transducer 12 bends, the lines along which the projections 185, 187 and 186, 188 retain the transducer 12 actually shift slightly off of center (i.e., the apex of the projection) so that the transducer 12 is contacted at different points depending upon the amount the transducer 12 is deflected. This configuration allows the retained end 121 of the transducer 12 to bend without point stresses by distributing the stresses, thereby increasing the durability of the transducer 12, and also providing less attenuation to the desired oscillation of the transducer 12 due to the clamping.

Electrical contact to each of the faces 12a, 12c of the transducer 12 may be provided by use of wires 14 soldered to each face 12a, 12c. Alternately, conductive foil may be adhered to each face 12a, 12c of the transducer 12. As yet another alternative, by using metallic projections 185-188 on the clamping plates 175, 177, electrical contact with each of the faces 12a, 12c of the transducer 12 may be maintained, and conductors 14 may be attached to one or both of the projections 185, 186 and 187, 188 on each side 12a, 12c of the transducer 12, or alternately to the projections 185, 186 and 187, 188 via each of the plates 175, 177. By making electrical connections to conductive projections 185-188, bending and point stresses are eliminated from the conductors 14 electrically connected to each face 12a, 12c of the transducer 12 as it is bent.

Referring to FIGS. 6-8: As mentioned above, it is desirable to generate an electrical signal by deforming the transducer 12. Deformation of the transducer 12 may be accomplished by any suitable means such as manually or by mechanical deflection means such as a plunger, lever or the like. In FIGS. 6-8 a simple deflector 72 is mounted to the base plate 70 in proximity to the free end 122 of the transducer 12. This deflector assembly 72 includes a lever 86 having first and second ends 87 and 88. The lever is pivotably mounted between the two ends 87 and 88 to a fulcrum 89. By exerting a force on the first end 87 of the lever 86 in the direction of arrow 91, the lever pivots about the fulcrum 89 and applies a mechanical impulse in the direction of arrow 81 to the free end 122 of the transducer 12. Alternatively, the lever 86 may be moved opposite the direction of arrow 91 and the transducer 12 may thus be deflected in the direction opposite arrow 81.

Figure 11A:
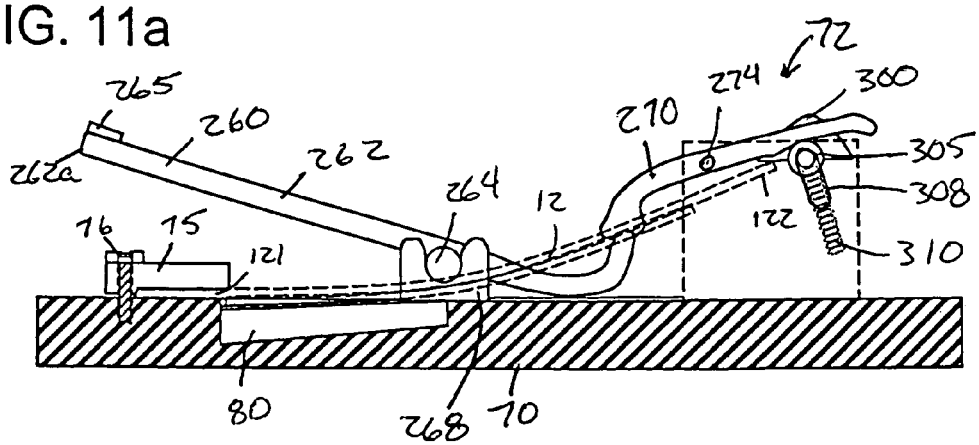
FIGS. 11a and 11b are elevation views of the preferred deflector assembly of the present invention showing the transducer in the undeflected and deflected positions respectively.
Figure 11B:
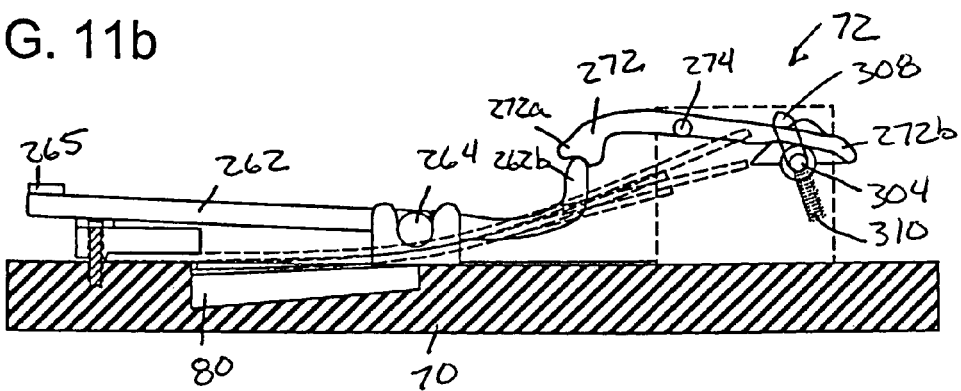
Figure 11C:
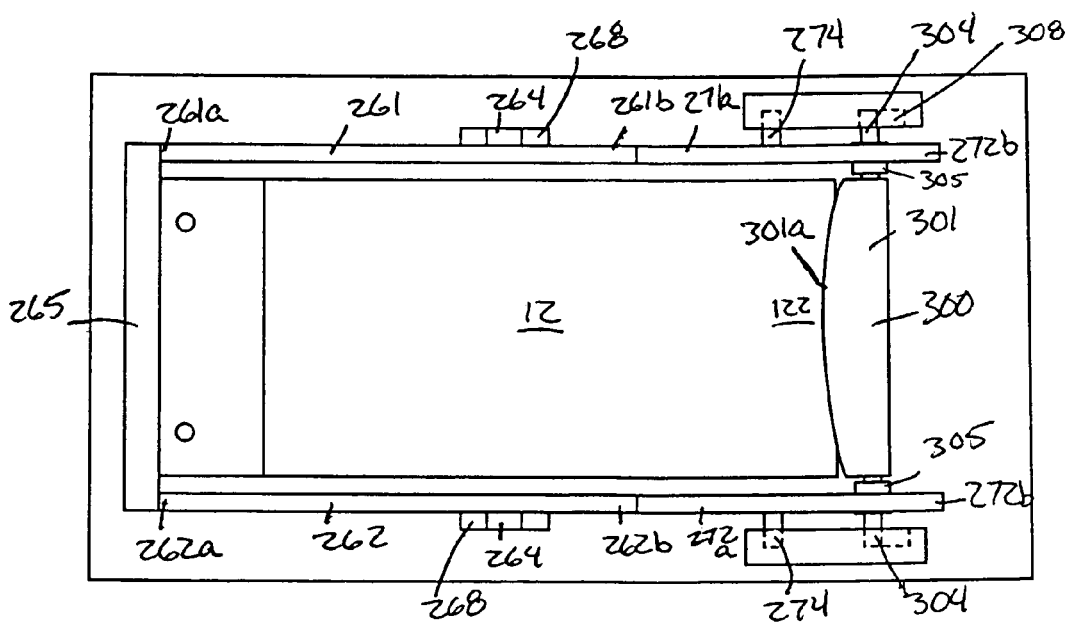
FIG. 11c is a plan view of the preferred deflector assembly of the present invention showing the transducer in the undeflected position.
Figure 12A:
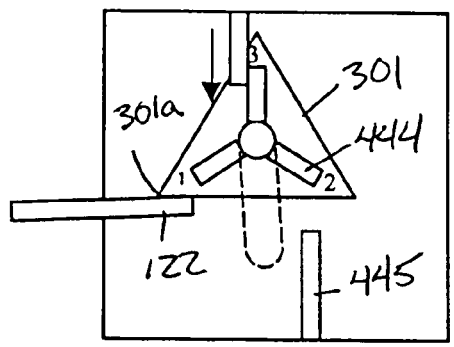
FIGS. 12a-e are elevation views of one embodiment of a plucker paddle mechanism as in FIGS. 11a-c, deflecting the end of an electroactive generator, and rotating/cocking to a reset position.
Figure 12B:
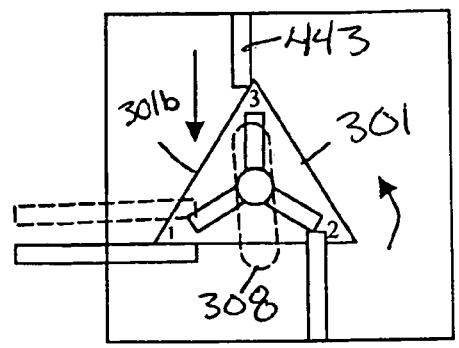
Figure 12C:
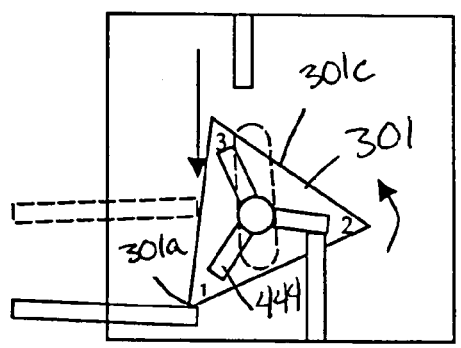
Figure 12D:
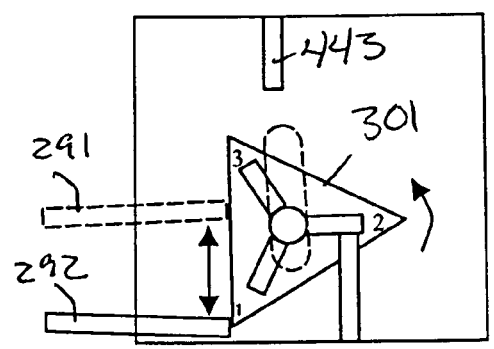
Figure 12E:
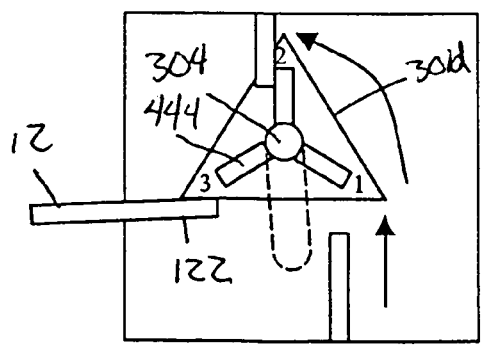
Figure 13A:
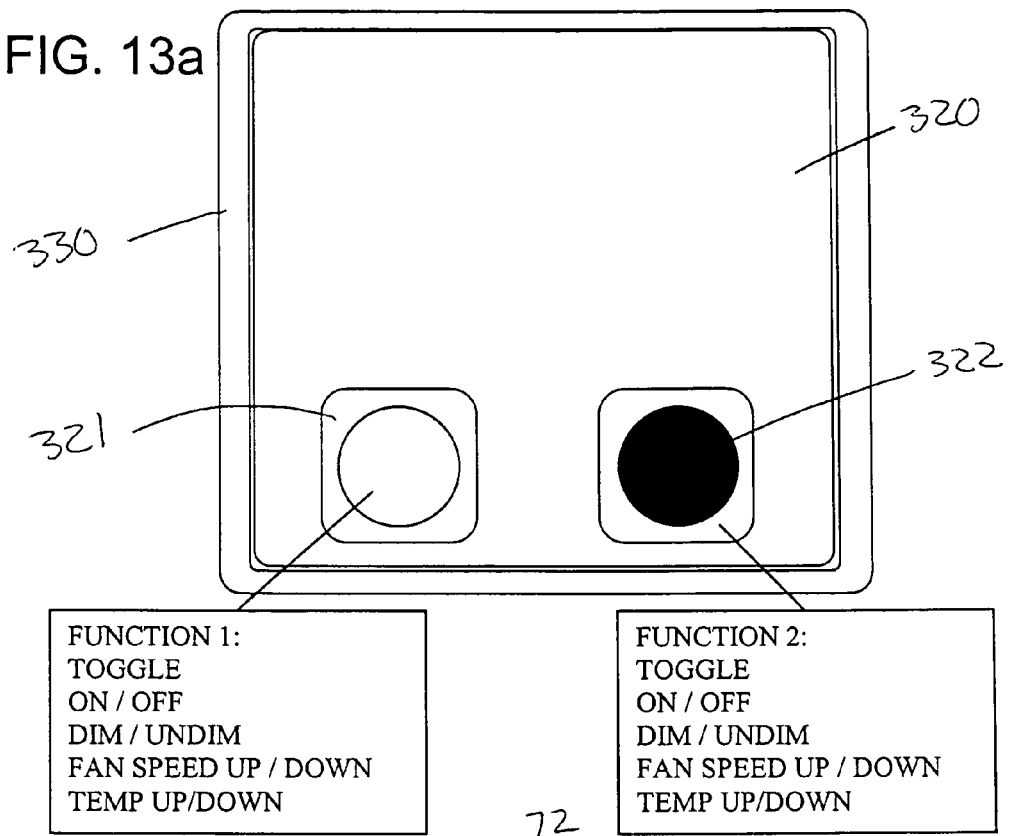
FIGS. 13a-b are a plan views of a multifunction switch incorporating the actuating mechanism of FIGS. 11a-c (shown in ghost in FIG. 13b)
Figure 13B:
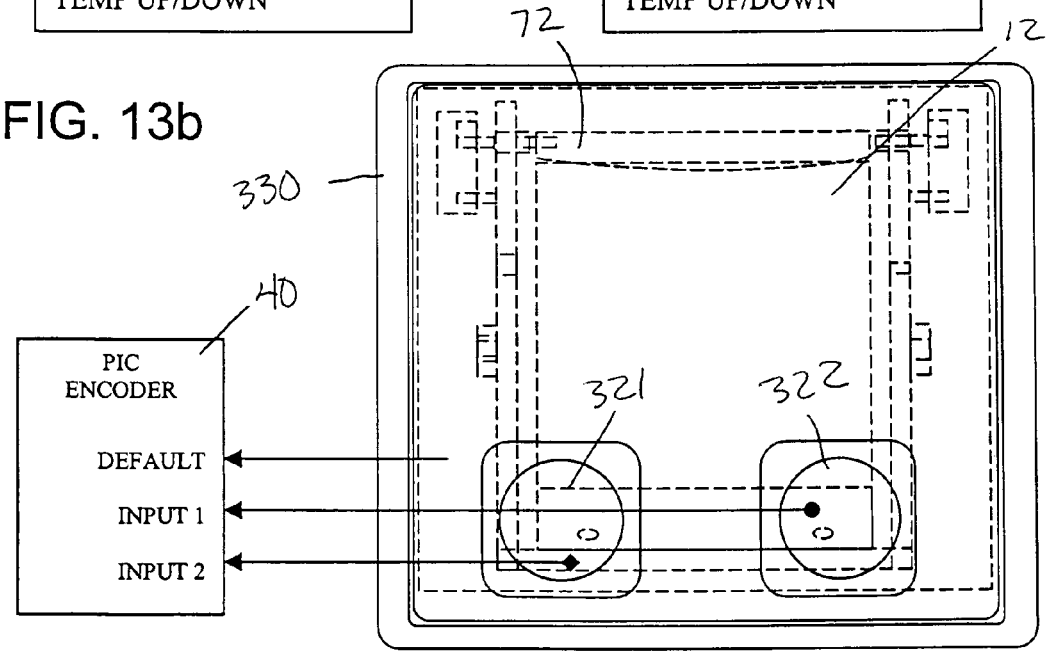
Figure 14:
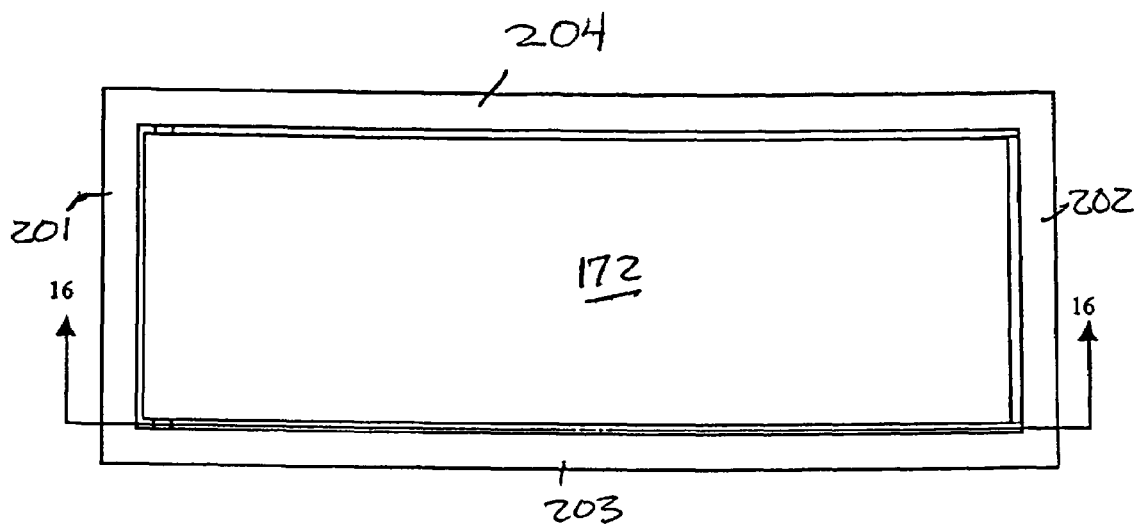
FIG. 14 is a plan view of an alternate embodiment of a deflector assembly and casing which enclose the transducer of the present invention.
Figure 15:
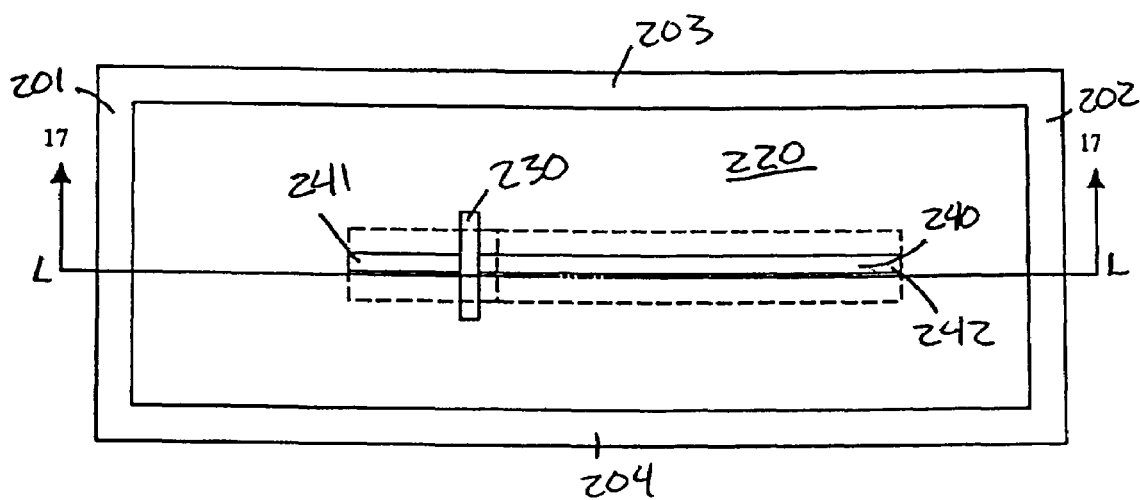
FIG. 15 is a plan view of an alternate embodiment of a deflector assembly using a sliding paddle.

Referring now to FIGS. 11a-c: FIGS. 11a-c show the preferred embodiment of a base plate 70 with a deflector assembly 72 and containing the transducer 12. The transducer 12 is mounted as in FIG. 7, with one end 121 of the transducer 12 placed between the surfaces the clamping and base plates 75 and 70 such that the substrate 64 contacts both surfaces 75a and 70a. Alternately, the end 121 of the transducer 12 may be mounted between clamping plates 185, 187 as shown in FIGS. 9a-c. The ceramic layer 67 which extends above the surface of the substrate 64 on the convex face 12a extends into the recessed area 80 of the base plate 70. This prevents the ceramic layer 67 from contacting the upper surface 70a of the base plate 70, and cushions the ceramic layer 67 against the compliant layer 85 in the recess 80, thereby reducing potential for damage to the ceramic layer 67. A deflector assembly 72 is mounted on the base plate 70 above and to the sides of the transducer 12. This deflector assemble 72 has a lower profile than previously described deflector assemblies 72 by virtue of the use of two cooperating counter-rotating lever assembles 260, 270 and a plucker assembly 300.

Referring again to FIGS. 11a-c: The deflector assembly comprises a swing arm 260, which is essentially a first lever mounted above the clamped end 121 of the transducer 12 and tending towards the free end 122. The swing arm 260 preferably has two pivot arms 261 and 262 connected by a cross bar 265. The pivot arms 261 and 262 tend from above the clamped end 121 of the transducer 12 and tending towards the free end 122 of the transducer 12, along each side of the transducer 12 to prevent contact therebetween. A first end 261a, 262a of each pivot arm 261, 262 is connected to the two ends of a cross bar 265, which is situated above the clamping plate 75. Each pivot arm 261, 262, has a pin 264 extending outwardly from the transducer 12, located centrally on the pivot arms 261, 262. The pins are pivotably mounted within fulcrum clips 268, which allows the swing arm assembly 260 to pivot about the pins 264 and the fulcrum clips 268. The ends 261b, 262b of the pivot arms 261, 262 opposite the crossbar 265 are preferably upwardly curved to tend substantially vertically, or more preferably slightly off vertical and towards the free end 122 of the transducer 12 and rocker arm 270 assemblies. The curved ends 261,b, 262b of the pivot arms 261, 262 may alternately be C-shaped, i.e., first curve downwardly (towards the base plate 70, and then upwardly. To accommodate the downward curve of the pivot arm ends 261b, 262b, the base plate 70 may contain recesses (not shown) within which the curved ends 261b, 262b may housed.

Referring again to FIGS. 11a-c: The deflector assembly also comprises a rocker assembly 270, which is essentially a pair of second levers 271, 272 mounted above the free end 122 of the transducer 12 and tending towards and beyond the free end 122. The rocker assembly 270 preferably has two rocker arms 271 and 272 pivotably mounted to contact both the pivot arms 261, 262 and the plucker assembly 300. The rocker arms 271 and 272 tend from above the curved ends 261b, 262b of the pivot arms 261, 262 and tend towards and slightly beyond the free end 122 of the transducer 12, and along each side of the transducer 12 to prevent contact therebetween. Each of the rocker arms 271, 271 has a pin 274 thereon, extending outwardly from the transducer 12. Each of these pins 274 is pivotably mounted within a pivot hole 278 of the plucker housing 290. This allows each rocker arm 271, 272, to rotate about its respective pin 274 in response to a force on either end 271a, 272a, 271b, 272b of the rocker arm 271, 272. Each first end 271a, 272a of the rocker arms 271, 272 is in contact with the second ends 261b, 262b of the pivot arms 261, 262. When the crossbar 265 is depressed, the second ends 261b, 262b of the pivot arms 261, 262 move upwardly and contact the first ends 271a, 272a of the rocker arms 271, 272, causing the rocker arms 271, 272 to rotate about the rocker arm pins 274. This causes the second ends 271b, 272b of the rocker arms 271, 272 to be depressed.

Referring again to FIGS. 11a-c: The deflector assembly also comprises a plucker assembly 300, which is essentially a slidably mounted curved paddle situated above the free end 122 of the transducer 12. The plucker assembly 300 is in contact with the rocker assembly 270 and is adapted to side downwardly within a pair of grooves in response to a downward motion from the second ends 271b, 272b of the rocker arms 271, 272. More specifically, the plucker assembly 300 comprises a plucker paddle 301, situated above and in contact with the free end 122 of the transducer 12. Connected to each end 301a, 301b of the plucker paddle 301 is a roller 305, which is in contact with the rocker arms 271, 272. Tending outwardly from each roller 305 is a slide pin 304. The slide pins 304 are slidably mounted within slide grooves 308 in the plucker housings 290. The slide grooves 308 tend from a maximum vertical position and downwardly away from the free end 122 of the transducer 12 to a minimum position beyond the free end 122 of the transducer 12. Thus, when the plucker assembly 300 is moved downwardly, the slide pins 304 and slide grooves 308 cause the plucker paddle 301 to move simultaneously downward and away from the free end of 122 the transducer 12.

Thus, when the crossbar 265 is depressed, the second ends 261b, 262b of the pivot arms 261, 262 move upwardly and contact the first ends 271a, 272a of the rocker arms 271, 272, causing the rocker arms 271, 272 to rotate about the rocker arm pins 274. This causes the second ends 271b, 272b of the rocker arms 271, 272 to be depressed. As the second ends 271b, 272b of the rocker arms 271, 272 are depressed, they contact the rollers 305 with a downward force, and the plucker assembly 300 is guided by the slide pins 304 and slide grooves 308 to cause the plucker paddle 301 to move simultaneously downward and away from the free end of 122 the transducer 12. The minimum or lowest position of the plucker assembly is beyond the free end 122 of the transducer 12, and therefore, as the plucker paddle 301 moves downward and outward, the free end 122 of the transducer 12 is released by the plucker paddle 301. Thus as the plucker assembly is depressed, the free end 122 of the transducer 12 is depressed from its neutral position 291 to a deflected position 292 at which position the paddle 301 releases the free end 122 of the transducer 12. The free end 122 of the transducer 12 then oscillates between positions 291 and 292.

Referring now to FIG. 11c: The plucker paddle 301 preferably has an edge 301a that contacts the free end 122 of the transducer 12 that has a radius in both in the thickness dimension (i.e., vertically corresponding to the thickness of the transducer 12 edge) and the transverse dimension (i.e., horizontally corresponding to the length of the transducer 12 edge) in order to advantageously release the free end 122 very quickly, i.e., without dragging across the end 122 of the transducer 12, which slows its release. It has been found that the more quickly and cleanly you release the end 122 of the transducer 12 during a "pluck", the greater the output. This increases output without increasing the required plucking force. To be precise, the energy developed by the piezoelectric element 67 has been found to be a function of the acceleration of the piezoelectric element 67, rather than the speed of the "pluck." It is possible "pluck" very slowly, and get excellent performance, so long as the piezoelectric element 67 is released fully and completely and as nearly instantly as possible. To determine the desired shape of the tip 301a of the plucker paddle 301, several plucker paddles were designed and released very, very slowly, in attempting to get a quick "release" of the end 122 of the transducer 12. If the plucker paddle 301 did not have a radius on the tip, but instead had a rectangular shape, it was found that the end 301a of the plucker paddle 301 (the thickness dimension) actually "dragged" across the edge 122 of the transducer 12, slowing the release, and decreasing the electrical output. Thus, increasing the rate of "release" of the element's edge 122 improved the acceleration and the output. Thus, the radius of the tip 301a (in the thickness dimension) of the "plucker" paddle 301 contributes substantially to how quickly the transducer 12 edge 122 gets off the paddle. This has been shown to have a direct effect on electrical performance, because a smaller radius equates to a quicker "release" which equates to greater electrical output. If the paddle 301 is manufactured from sufficiently hard materials, or is hardened, the edge 301a of the paddle 301 can be made with an even smaller radius. The tip 301a of the plucking paddle 301 may be coated with a very hard material with low friction, thereby lowering the plucking resistance. This approach can prove to be useful in increasing the power output of a transducer 12 without increasing the required displacement or amount of bending, and may allow the generation of the same amount of energy with lower "button force" by the user of the device, as well as being useful in increasing wear resistance for applications requiring many hundreds of thousands of switch cycles.

The transducer 12 is typically is curved along its length, i.e., the longitudinal dimension and this curvature allows the element 12 to be bent or "plucked" substantially before it reaches a flattened state. The transducer 12 is also curved across its transverse dimension, i.e., the transverse dimension normal to the thickness and longitudinal dimensions. To ensure a quick "release", the shape of the edge 301a of the plucking paddle 300 should generally match this transverse curve. The radius curvature of the transducer 12 in the transverse plane is approximately 6 inches, and therefore the same radius should be used for the curve edge 301a in the transverse plane of the paddle 301. Different sized transducers 12 will have higher or lower transverse radii of curvature, so regardless of the size of the transducer 12, the radius of curvature for the curved edge 301a in the transverse plane of the paddle 301 should substantially match the transverse curvature of the transducer 12.

Although both paddle 301 dimensions affect durability, and both dimensions affect performance, the tip radius has more of an effect on element 12 performance, while the transverse curve has a greater effect on the element's 12 substrate wear, and therefore is more of an influence on its life expectancy. This is because the transverse radius determines how much of the paddle 301 contacts the element 12. A greater contact area is equates with less wear and longer substrate life, i.e., durability. As stated above, by manufacturing the paddle 301 from sufficiently hard or hardened materials, the edge 301a of the paddle 301 can be made with very small radius. The tip 301a of the plucking paddle 301 may be coated with a very hard material with low friction, thereby lowering the plucking resistance. Hardened, low friction materials are useful in increasing the power output of a transducer 12 without increasing the required displacement or amount of bending, or allowing the generation of similar electrical energy output with lower "button force", and increasing wear resistance.

Referring again to FIGS. 11a-c: In order to return the deflector assembly 72 to its normal elevated position, the levers 260, 270 and/or plucker assembly 300 are preferably spring loaded. More specifically, one or more springs 310 are located in contact with the deflector assembly 72, and are placed in compression or tension upon actuation of the assembly 72, which springs' 310 restoring force is used to return the deflector assembly 72 to its neutral position. As shown in FIGS. 11a-c, in the preferred embodiment of the invention, two springs 310 are located within cavities 320 in the plucker housings 290, below the pins 304. For simplicity of illustration, the springs 310 are shown as coiled springs 310, but are preferably leaf springs 310. Upon downward deflection of the crossbar 265 and thereby the pivot bar assembly 260 and rocker assembly 270, the pins 304 travel down the grooves 308 and compress the springs 310 in the cavities 320. Upon release of pressure from the crossbar 265, the springs 310 restore the pivot bar 260, rocker bars 270 and plucker 300 to their undeflected positions. While the springs 310 shown are in the housings 290, other placements of the springs 310 may also be desirable, including, for example: spring(s) 310 may be placed beneath the cross bar 265, on either side of the fulcrum 268 of the pivot bars 261, 262 or rocker arms 270; one or more rotational or clock springs 310 may be placed on the pins 264 of the pivot bars 261, 262, on the pins 274 of the rocker arms 271, 272, on the pivot bar fulcrums 268, or the rocker arm pin holes 278; springs 310 may be placed in the groove 308 or recess 320 above or below the plucker bar pins 304; one or more springs 310 may be attached to the plucker bar 301; and the opposing side of the spring 310 (not attached to the deflector assembly 72) may be attached to the base plate 70, the plucker housing 290, the fulcrum 268 or to another part of the deflector assembly 72 to restore it to its undeflected position.

Referring now to FIGS. 12*a-e*: To facilitate efficient plucking and maximize vibration of the transducer 12, the plucker assembly is preferably configured so as to rotate during each actuation and to cock after each actuation. Specifically, with a triangularly shaped plucker paddle 301, any one of the three faces 301*b*, 301*c*, 301*d* of the plucker paddle 301 (having a substantially triangular cross-section) may engage the edge of the transducer. As the plucker paddle 301 moves downward and outward from the transducer edge, a rotation mechanism (including a pin 445 and radial ridge 444 as shown in the figures) causes the plucker paddle edge to rotate away from the transducer edge 122. As the plucker paddle rotates, it reaches a point where the transducer edge 122 is released. Since the plucker paddle 301 has rotated, it also does not interfere with the vibration of the transducer edge. When the downward force is removed from the plucker assembly, the spring loaded plucker paddle 301 is returned upward towards its starting position, and rotates until the radial ridge 444 contacts a rotational stop 443, so that the plucker paddle 301 is again in a position to engage the transducer edge.

Referring again to FIGS. 12*a-e*: More specifically, the plucker paddle 301 is shaped substantially like a triangular prism. In the center of each triangular face of the paddle is a pin 304 that travels along the groove 308 in the plucker housing. Each triangular face of the paddle also preferably has threes raised ridges 444 thereon extending from the center of the triangular face outwardly towards the edges of the triangular faces adjacent the flat paddle surfaces and most preferably towards each apex of the triangular faces. The plucker housings each have a vertical ridge or pin 443 against which the raised ridge rests when the plucker paddle is in its maximum position. This maintains the bottom surface of the plucker paddle (opposite the apex bisected by the raised ridge) in an essentially horizontal position above and/or against the edge of the transducer 12.

Figure 10A:
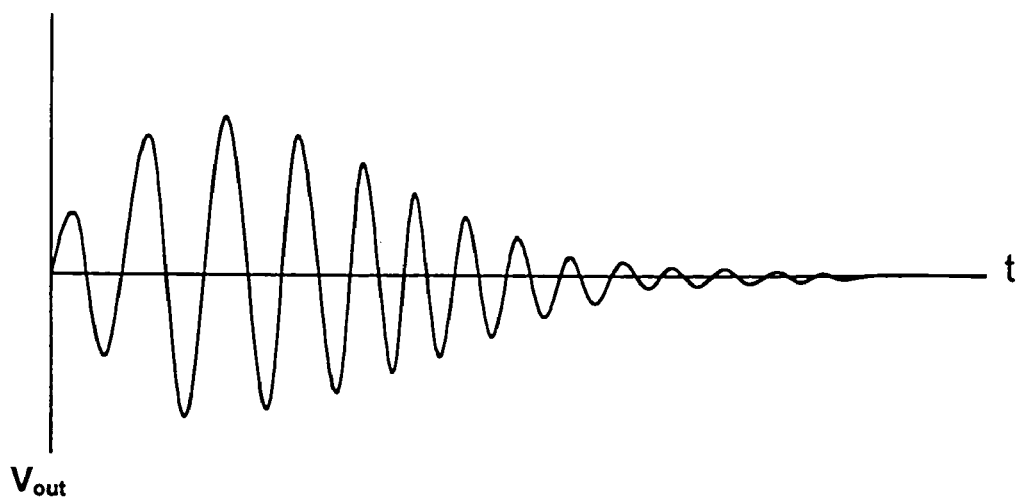
FIGS. 10a-c show the electrical signal generated by the transducer, the electrical output signal of the rectifier at the junction with the capacitor and the regulated electrical signal respectively.

A force applied to the deflector assembly 72 described above causes the piezoelectric transducer 12 to deform from position 291 to position 292 and by virtue of the piezoelectric effect, the deformation of the piezoelectric element 67 generates an instantaneous voltage between the faces 12*a* and 12*c* of the transducer 12, which produces an electrical signal. Furthermore, when the force is removed from the piezoelectric transducer 12, i.e., when released by the plucker assembly 300 at position 292, the transducer 12 oscillates between positions 291 and 292 until it gradually returns to its original shape. As the transducer 12 oscillates, the ceramic layer 67 strains, becoming alternately more compressed and less compressed. The polarity of the voltage produced by the ceramic layer 67 depends on the direction of the strain, and therefore, the polarity of the voltage generated in compression is opposite to the polarity of the voltage generated in tension. Therefore, as the transducer 12 oscillates, the voltage produced by the ceramic element 67 oscillates between a positive and negative voltage for a duration of time. The duration of the oscillation, and therefore the duration of the oscillating electrical signal produced, is preferably in the range of 100-250 milliseconds, depending on the shape, mounting and amount of force applied to the transducer 12. The wave form of the oscillating voltage is illustrated in FIG. 10*a*.

Referring now to FIGS. 14 and 16*a-c*: FIGS. 14 and 16*a-c* show an alternate embodiment of a casing with a deflector assembly 72 and containing the transducer 12. The base plate 70 forms the base of a casing 200, which encloses the transducer 12. On each side of the casing 200 is a wall 201, 202, 203 and 204 which extends perpendicularly from the top surface 70*a* of the base plate 70. On one end of the casing 200 is mounted a deflector assembly 72 or plunger. The plunger has an interior surface 172*b* and an exterior surface 172*a*, as well as a free end 173 and a mounted end 174. More specifically, the plunger 172 is pivotably mounted on one end 174 to a wall 201 of the casing 200. The free end 173 of the plunger 172 has a ridge 173*a* thereon which engages a lip 202*a* on the opposite wall 202 of the casing. Preferably the free end 173 of the plunger 172 is spring loaded so that the ridge 173*a* is constantly urged towards the lip 202*a*. To this end, there is a preferably a spring 150 held in compression between the top surface 70*a* of the base plate 70 and the ridge 173*a* or interior surface of the plunger 172*b*. This provides for device wherein an transducer 12 mounted on a base plate 70 is contained within a casing 200 formed by the base plate 70 and four walls 201, 202, 203 and 204 as well as a plunger 172 pivotably mounted opposite the base plate 70 on a wall 201 of the casing 200. Because the plunger is pivotably mounted, placing pressure (in the direction of arrow 180 on the on the exterior surface 172*a* of the plunger 172 makes it pivot about the hinge 175 toward the top surface 70*a* of the base plate 70. Because the plunger is pivotably mounted and spring loaded, releasing pressure from the on the exterior surface 172*a* of the plunger 172 makes it pivot about the hinge 175 away the top surface of the base plate 70 until the ridge 173*a* catches on the lip 202*a*.

Within the casing 200 is a mounted quick release mechanism 180 comprising a spring loaded rocker arm 185 on the interior surface 172*b* of the plunger 172 which works in conjunction with a release pin 186 mounted on the top surface 70 of the base plate 70. The quick release mechanism 180 is designed to deflect and then quickly release the free end 122 of the transducer 12 in order to allow it to vibrate between positions 291 and 292. The quick release mechanism 180 is also designed not to interfere with the vibration of the transducer 12 as well as to return to a neutral position for follow-on deflections of the transducer 12.

Figure 16A:
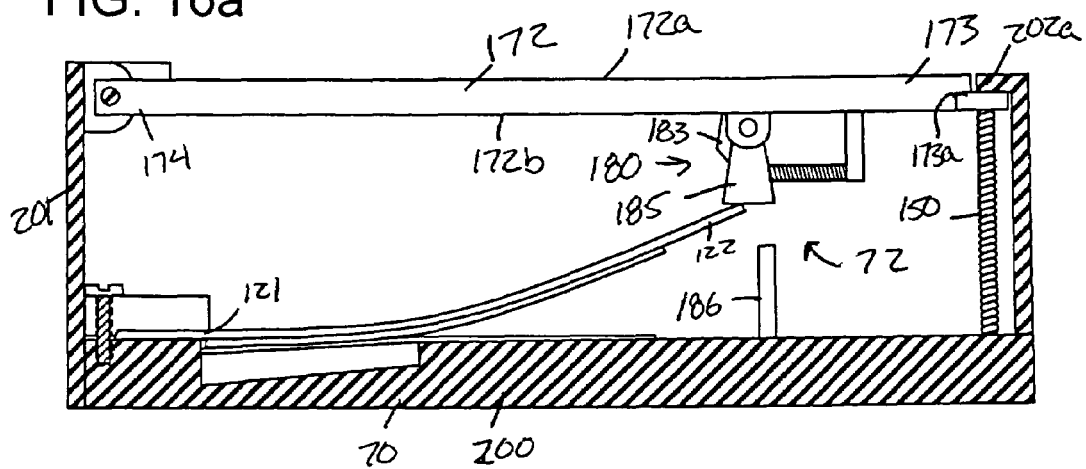
FIGS. 16a-c are elevational cross-sections taken along line 16-16 of FIG. 14.
Figure 16B:
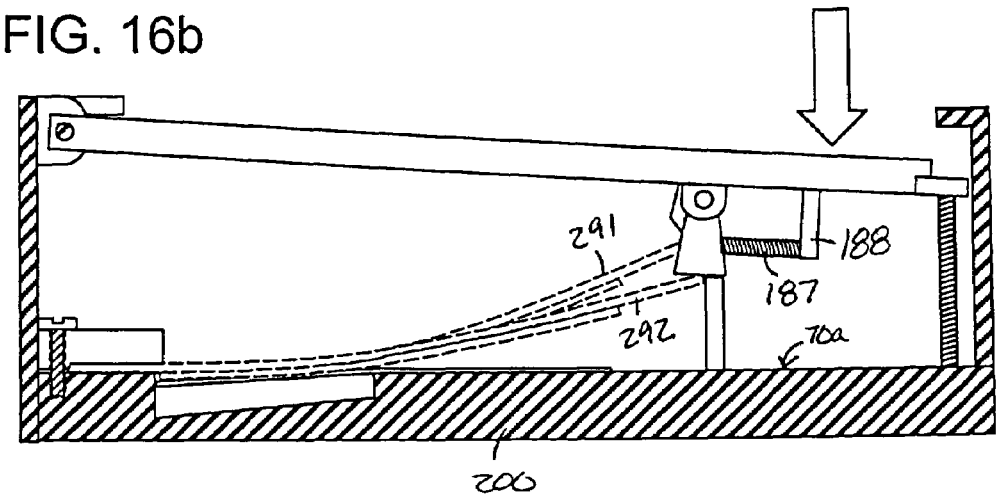
Figure 16C:
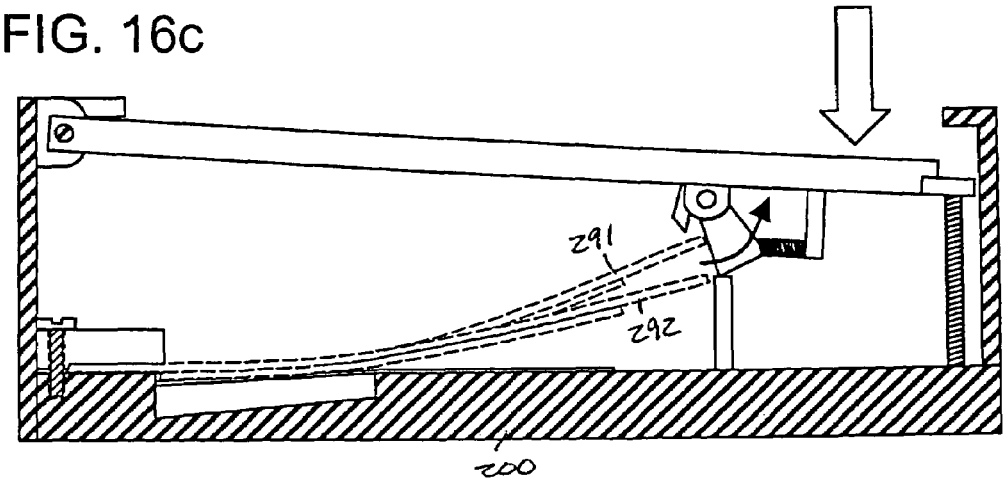
Figure 17A:
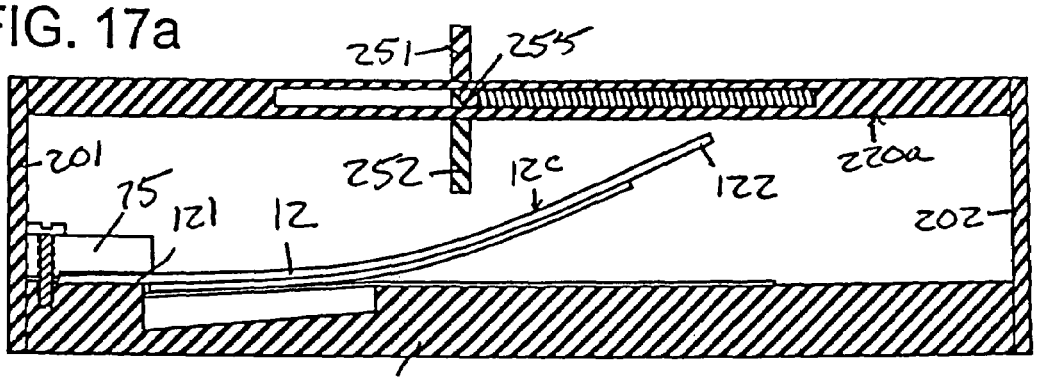
FIGS. 17a-d are elevational cross-sections taken along line 17-17 of FIG. 15.
Figure 17B:
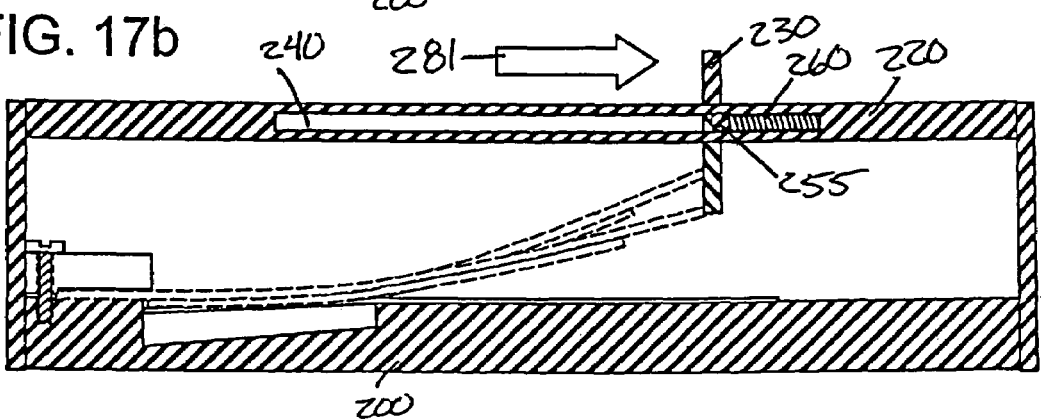
Figure 17C:
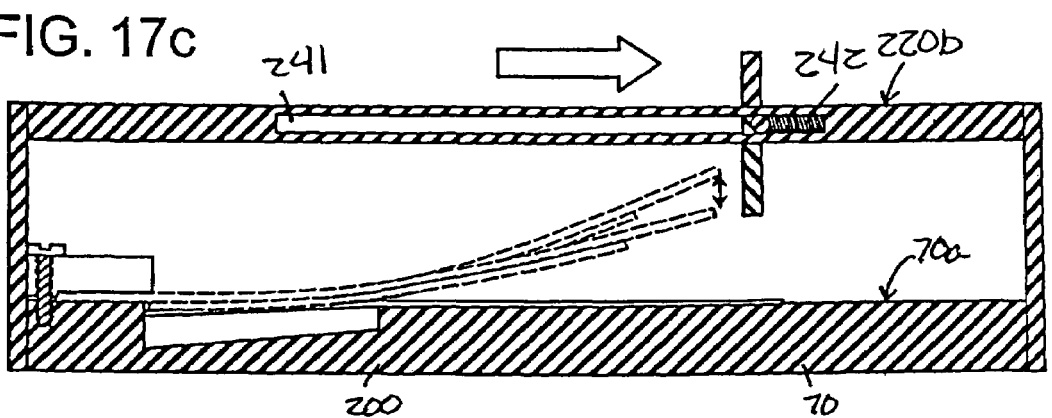
Figure 17D:
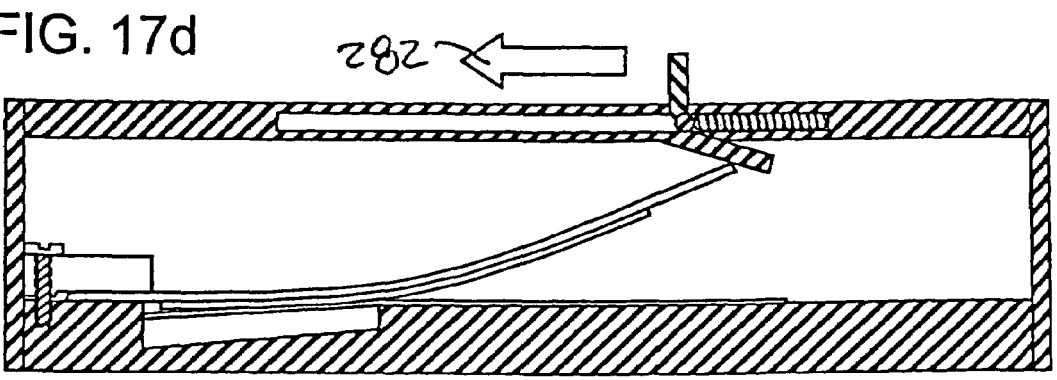

Referring to FIGS. 16*a-c*: The rocker arm 185 is pivotably attached to the interior surface 172*b* of the plunger 172 above the free end 122 of the transducer 12. More specifically, the rocker arm 185 is pivotably attached in such a way that it has a neutral position from which it may pivot away from the clamped end 121 of the transducer 12, but will not pivot towards the clamped end 121 of the transducer 12 from that neutral position. In other words a rotational stop 183 forms part of the quick release mechanism 180 and its placement prevents the rocker arm from pivoting beyond the neutral position at the stop 183. The rocker arm 185 is preferably spring loaded in order to keep the rocker arm 185 in its neutral position when not being deflected. To this end a spring 187 in compression is placed on the side of the rocker arm 185 opposite the stop 183, between the rocker arm 185 and a spring stop 188.

Inside the casing 200 is also a release pin 186 which is located on the top surface 70a of the base plate 70. The release pin 186 is located in a position just beyond the free end 122 of the transducer 12 in its deflected position, but not beyond the rocker arm 185. In other words, when the plunger 172 is depressed toward the release pin 186, depressing with it the transducer 12 from position 291 to position 292, the release pin 186 will contact the rocker arm 185 but not the transducer 12. As the rocker arm 185 (and transducer 12) are depressed further, the release pin 186 pushes the rocker arm 185 away, making the rocker arm 185 pivot away from the clamped end 121 of the transducer 12. The rocker arm 185 pivots until the edge 122 of the transducer 12 is no longer held by the rocker arm 185 in position 292, at which point the edge 122 of the transducer 12 is released and springs back to its undeformed state, thereby oscillating between positions 291 and 292.

When pressure from the plunger 172 is released, the plunger 172 returns to its undeflected position (with the ridge 173a against the lip 202a) by virtue of the restoring force of the spring 150. Also when the pressure from the plunger 172 is released, and the plunger 172 returns to its undeflected position, the rocker arm 185 also returns to its undeflected position (above the transducer 12 against the stop 183) by virtue of the restoring force of the spring 187. Lastly, the transducer 12 also returns to its undeflected state in position 291 after its oscillations between positions 291 and 292 have ceased.

Referring now to FIGS. 15 and 17a-d: FIGS. 15 and 15a-d show an alternate embodiment of a deflector assembly 72 mounted to a casing 200 that contains the transducer 12. The base plate 70 forms the base of a casing 200, which encloses the transducer 12. On each side of the casing 200 is a wall 201, 202, 203 and 204 which extends perpendicularly from the top surface 70a of the base plate 70. Attached to the top of the walls of the casing 200 (opposite the base plate 70) is a face plate 220 to which is mounted a slide mechanism 230 that acts as a deflector assembly 72. The face plate 220 has an interior surface 220a and an exterior surface 220b and a channel 240 extending through substantially the center of the face plate 220. The channel 240 has a first end 241 and a second end 242 and extends substantially linearly along an axis L perpendicular to the first and second walls 201 and 202 of the casing 200. In other words, the first end 241 of the channel 240 through the face plate 220 is in proximity to the first wall 201 of the casing 200 and the second end 242 of the channel 240 through the face plate 220 is in proximity to the second wall 202 of the casing 200. The second end of the channel 240 preferably extends further towards the second wall 202 of the casing than does the free end 122 of the transducer 12.

The channel 240 is adapted to slidably retain a spring loaded paddle 250. Preferably, the paddle has first and second ends 251 and 252 respectively and a central pin 255. The channel in the face plate 220 allows the paddle to extend through the face plate 220, while also slidably retaining the central pin 255 in the channel 240. More specifically, the paddle 250 extends through the face plate 220 by means of the channel 240, along which the paddle may be slid in a direction parallel to the channels' axis L, i.e., from the clamped end 121 to the free end 122 of the transducer 12 and back. The first end 251 of the paddle 250 is located above the exterior surface 220b of the face plate 220 and the second end 252 of the paddle 250 is located within the casing 200 above the transducer 12. The paddle 250 is retained in the described position be means of the pin 255 which is retained in the channel 240. Thus, the width of the channel 240 at the exterior surface 220b is sufficient for the paddle upper portion 251 to pass through, as is the width of the channel 240 at the interior surface 220a is sufficient for the paddle lower portion 252 to pass through. The width and height of the channel 240 within the face plate 220 (between the interior and exterior surfaces 220a and 220b) is sufficient to accommodate the width and height of the central pin 255, which is wider than the width of the paddle upper and lower portions 251 and 252.

The first end 251 of the paddle 250 preferably extends a distance above the exterior surface 220b of the face plate 220 enough to be grasped manually. The second end 252 of the paddle 250 preferably extends into the casing 200 a distance above the transducer 12 such that the paddle 250 does not contact the clamping member 75 and/or clamped end 121 of the transducer 12, but also far enough that it may contact and deflect the free end 122 of the transducer 12. The paddle 250 is also preferably hinged at the second end 252 (within the casing 200 or the channel 240 at or in proximity to the central pin 255) in a manner that allows the second end 252 to pivot about the hinge or central pin 255 when travelling in one direction but not the other. Preferably, the second end 252 of the paddle 250 is hinged in a way that it may pivot when the paddle 250 is travelling toward the first wall 201 of the casing 200 but not pivot when travelling towards the second wall 202 of the casing 200.

Preferably the paddle 250 is also spring loaded so that the paddle is constantly urged along the channel 240 towards the first wall 201 of the casing 200. To that end, there is a spring 260 held between the paddle and the first 201 or second wall 202 of the casing 200 or most preferably the spring 260 held between the paddle 250 and the first or second end 241 or 242 of the channel 240. In order to urge the paddle toward the first wall 201 the spring 260 is either held in tension between the paddle 250 and the first end 241 of the channel 240, or most preferably the spring 260 is held in compression between the paddle 250 and the second end 242 of the channel 240.

This provides for device wherein an transducer 12 mounted on a base plate 70 is contained within a casing 200 formed by the base plate 70, four walls 201, 202, 203 and 204 and a face plate opposite the base plate 70. Because the paddle 250 is slidably mounted, placing pressure (in the direction of arrow 281 on the on the 251 first end of the paddle makes it slide along the channel 240 toward the second wall 202 of the casing 200. Because the paddle 250 is slidably mounted and spring loaded, releasing pressure from the paddle 250 makes it return along the channel 240 toward the first wall 201 of the casing 200 until it comes to rest against the first end 241 of the channel 240.

Referring to FIGS. 16a-d: The paddle upper portion 251 is pivotably attached to the paddle lower portion 252 below the interior surface 220a of the face plate 220 (within the casing 200) above the transducer 12. More specifically, the paddle lower portion 252 is pivotably attached in such a way that it has a neutral position from which it may pivot away from the clamped end 121 of the transducer 12, but will not pivot towards the clamped end 121 of the transducer 12 from that neutral position. In other words the shape of the paddle 250 prevents the lower portion 252 from pivoting beyond the neutral position.

In operation, when the paddle 250 is moved (in the direction of arrow 281) toward the second end 242 of the channel 240, the paddle lower portion 252 contacts concave face 12c of the transducer 12 and commences to deflect the transducer 12 free end 122 (away from position 291). As the paddle 250 continues to move in the direction of arrow 281, the paddle lower portion 252 depresses the free end 122 of the transducer 12 to its maximum deflection at position 292 when the free end 122 is directly beneath the paddle lower portion 252. When the paddle moves further from this point in the direction of arrow 281, the free end 122 of the transducer 12 is abruptly released from the applied deflection of the paddle lower portion 252. Upon release, the edge 122 of the transducer 12 springs back to its undeformed state at position 291, thereby oscillating between positions 291 and 292. Upon release of pressure (in the direction of arrow 281) from the paddle 250, the paddle then travels in the direction of arrow 282, by virtue of the restoring force of the spring 260. As the paddle 250 returns towards its undeflected position (towards the first end 241 of the channel 240), the free end 122 of the transducer 12 in position 291 applies pressure against the lower portion 252 of the paddle 250. In response to the pressure being applied to the paddle lower portion opposite the direction of travel of the upper portion 251, the lower portion 252 pivots about the hinged central pin 255 of the paddle. After the paddle lower portion 252 has traveled in the direction of arrow 282 beyond the free end 122 of the transducer 12, the lower portion 252 returns to its undeflected (unbent) state. The pivoting of the paddle lower portion 252 allows the paddle 250 to return to its neutral undeflected position at the first end 241 of the channel 240.

When the end 122 of the transducer 12 is deflected and then released (either manually or using a deflector assembly 72 such as in FIGS. 6-7, or 11-16), the end 122 of the transducer 12, much like a diving board, oscillates back and forth between positions 291 and 292. This is because the substrate and prestress layer 64 and 68 to which the ceramic 67 is bonded exert a compressive force on the ceramic 67 thereby providing a restoring force. Therefore, the transducer 12 has a coefficient of elasticity or spring constant that causes the transducer 12 to return to its undeformed neutral state at position 291. The oscillation of the transducer 12 has the waveform of a damped harmonic oscillation, as is illustrated in FIG. 10a. In other words, the amplitude of the oscillation of the free end 122 of the transducer 12 is at its maximum immediately following (within a few oscillations after) the release of the mechanical impulse from the free end 122 of the transducer 12. As the transducer 12 continues to vibrate, the amplitude gradually decreases over time (approximately exponentially) until the transducer 12 is at rest in its neutral position 291, as shown in FIG. 10a.

The applied force, whether by manual or other mechanical deflection means 72 causes the piezoelectric transducer 12 to deform and by virtue of the piezoelectric effect, the deformation of the piezoelectric element 67 generates an instantaneous voltage between the faces 12a and 12c of the transducer 12, which produces an electrical signal. Furthermore, when the force is removed from the piezoelectric transducer 12, the transducer 12 oscillates between positions 291 and 292 until it gradually returns to its original shape. As the transducer 12 oscillates, the ceramic layer 67 strains, becoming alternately more compressed and less compressed. The polarity of the voltage produced by the ceramic layer 67 depends on the direction of the strain, and therefore, the polarity of the voltage generated in compression is opposite to the polarity of the voltage generated in tension. Therefore, as the transducer 12 oscillates, the voltage produced by the ceramic element 67 oscillates between a positive and negative voltage for a duration of time. The duration of the oscillation, and therefore the duration of the oscillating electrical signal produced, is preferably in the range of 100-500 milliseconds, depending on the shape, mounting and amount of force and number of plucks applied to the edge of the transducer 12.

The electrical signal generated by the transducer 12 is applied to downstream circuit elements via wires 14, and conductive foil, solder or conductive adhesive connected to the transducer 12. More specifically, a first wire 14 is connected to the electrode 90 which extends into the recess 80 and contacts the electrode 68 on the convex face 12a of the transducer 12 or to a foil adhered to the lower face 12a of the transducer 12. Preferably the wire 14 is attached to a conductive foil (not shown) adhered to the face 12a of the transducer 12 situated above the recess 80 and compliant layer 85. Alternately, the wire 14 is connected to the electrode 90 outside of the recess close to the end of the base plate 70 opposite the end having the clamping member 75. A second wire 14 is connected directly to the first prestress layer 64, i.e., the substrate 64 which acts as an electrode on the concave face 12c of the transducer 12.

In each embodiment of a self powered RF signal generator, the transducer 12, base 70, 200 and associated transmission circuitry are enclosed in a case, such as described above having a base 200, and wall 2021, 202, 203 and 204, as well as a top face. The case may be made of a variety of materials including plastics and metal or combinations thereof. Most preferably, the outer case (top face and wall comprise plastic. It has been discovered that the character of the RF signal radiated from the antenna 60 in the transmitter circuit 126 varies with the placement of the antenna in relation to parts of the casing as well as other obstructions placed in proximity to the antenna. To this end it is preferred that the antenna 60 be fixedly mounted to the base 200, and/or walls 201, 202, 203 and 204 of the casing. Most preferably, the antenna is affixed to the casing in a channel in the base 200, and/or wall 201, 202, 203 and 204 or otherwise fixed thereto. Furthermore, it is preferable that at least a portion of the base be made of metal. Objects (i.e., in walls) to which the base 200 is mounted may cause interference with the signal radiated from the antenna 60. Therefore a portion of the base 20 is preferred to be metallic in order to shield the antenna from any interference.

Electromagnetic Generator

Figure 18:
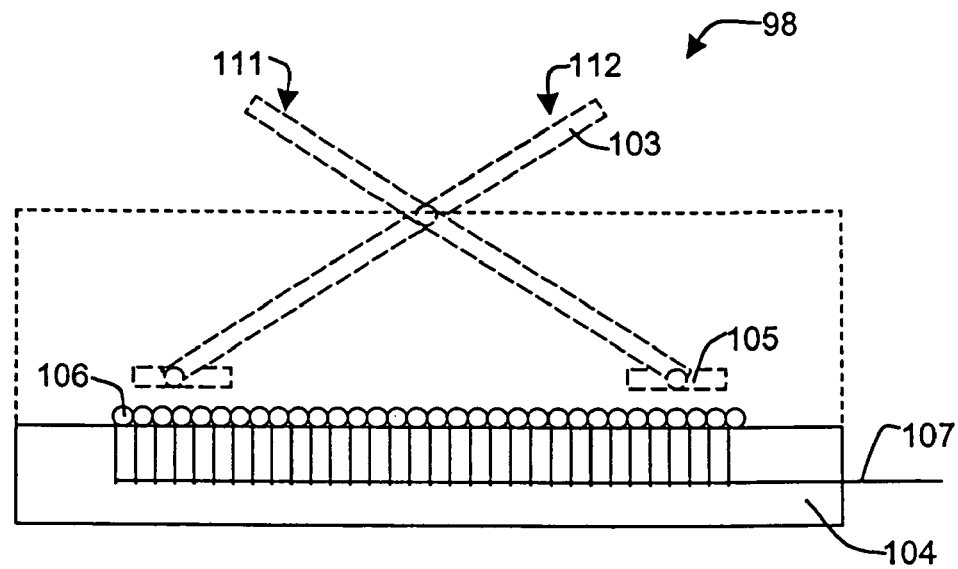
FIG. 18 is an elevation view of a linear magnetic microgenerator.
Figure 19:
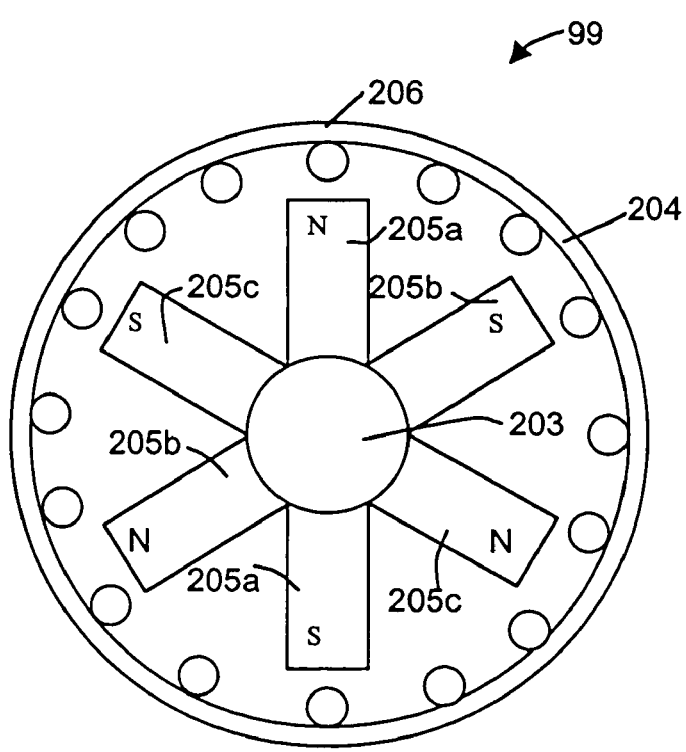
FIG. 19 is an elevation view of a rotary magnetic microgenerator.

Referring to FIGS. 17 and 18: In an alternate embodiment of the invention, the electromechanical energy is provided using a magnetic based microgenerator, rather than a piezoelectric device. The actuation means for generating the electrical signal comprises a magnet and a series of coils, which generate an electrical signal in response to relative motion between the magnet and the coils. A rotary or linear DC motor may be used as a generator in a manner similar to that used in an electric car to recharge the batteries during regenerative braking, in order to generate electrical energy for actuating a latching/relay mechanism and/or powering an RF generation circuit. The magnetically based microgenerator may be used rotary, having a rotor and stator to generate an electric impulse in wire coils due to relative motion between the magnetic field and the coil. Alternatively the microgenerator may be linearly operated. Preferably a small rare earth magnet, which has a high magnetic field per unit volume, is moved along a line in relation to several wire coils to generate the electrical impulse.

Referring again to FIGS. 17 and 18: In the preferred embodiments of the electromagnetic generator 98 or 99, mechanical or manual actuation means, such as a linear switch 103 or rotary switch 203 is coupled to one or more magnets 105 or 205a-c respectively, and more preferably a rare earth magnet. Rare earth magnets are preferred because they have higher magnetic fields than typical permanent magnets. A small rare earth magnet may be used so that the electromagnetic generator may be made more compact.

The electromagnetic generator 98 or 99 also comprises a series of wire coils 106 or 206. More specifically, for a magnet 105 coupled to a linear switch 103, a series of small wire coils 106 are arranged along a substrate 104 in close proximity to and substantially parallel to the longitudinal axis along which the rare earth magnet 105 moves in response to actuation of the linear switch 103. Alternately, the coils comprise a series of coils 206 arranged on the interior of a circular substrate 204, i.e., around a central axis about which the magnets 205a, 205b and 205c rotates in response to actuation of a rotary switch 203. There may be as few as one coil, but preferably at least three coils are located along the axis relative to which the magnet moves. More specifically, 6 or more coils are preferably evenly spaced along the axis of motion of the magnet, which for a linear actuator 98 is at least three times the length of the magnet.

In operation, when the manual or mechanical actuation of the linear switch 103, the attached magnet 105 moves along longitudinal axis from position 111 to position 112. As the magnet 105 passes a coil 106, the changing magnetic field creates an electric field in the coil 106. The current flows from ground (not shown) through the coil 106 and into a wire 107 connected to a conductor 14. This happens at each coil 106 so that as the magnet 105 passes the series of coils 106 an electric field is generated in each coil 106 and is summed at conductor 14. In a like manner, when the rotary switch 203 in the embodiment of FIG. 11 is rotated, the magnet(s) 205a-c move in relation to the coils 206 attached to the periphery of the casing 204 of the electromagnetic motor 99, and generate an electric field in a like manner.

Switch Initiation System

Referring to FIGS. 6 and 7: The pulse of electrical energy is transmitted from the transducer or generator 12, 98 or 99 via the electrical wires 14 connected to each of the transducer 12 to a switch or relay 90. The pulse of electrical energy is of sufficient magnitude to cause the switch/relay 90 to toggle from one position to another. Alternatively and preferably, the electrical pulse is first transmitted through a pulse modification circuit 10 in order to modify the character, i.e, current, voltage, frequency and/or pulse width of the electrical signal.

Figure 10B:
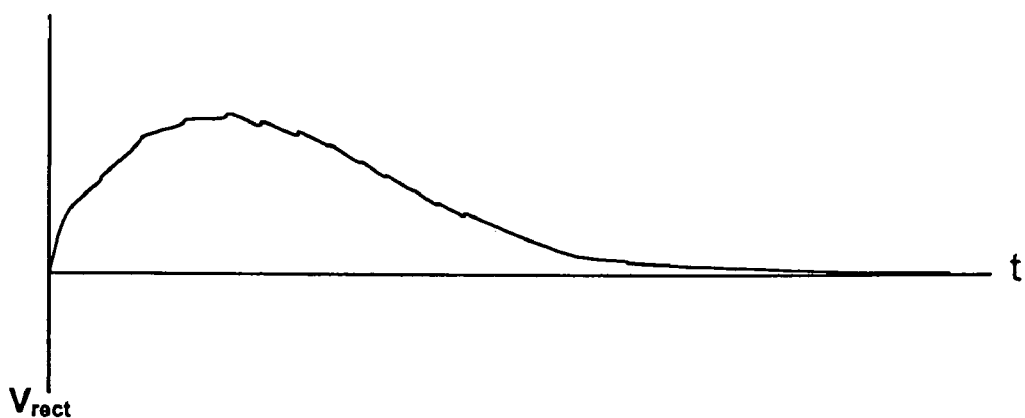
Figure 10C:
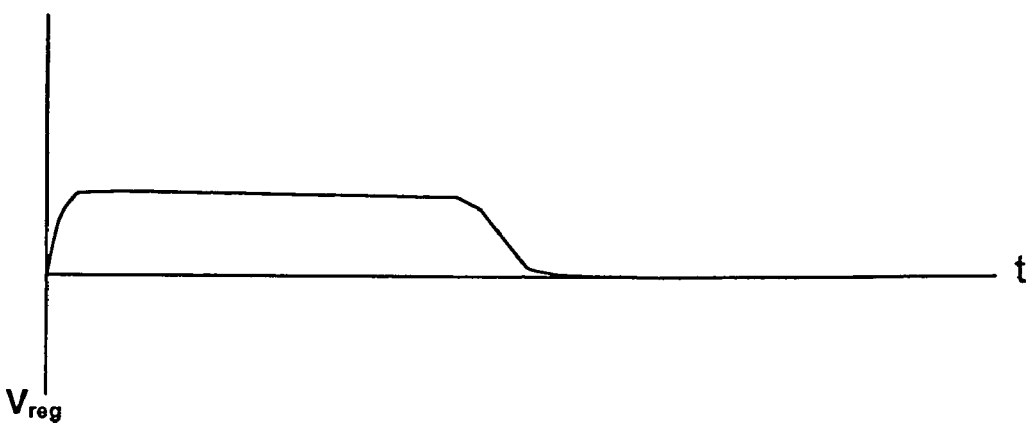

Referring to FIGS. 20-25, the transducer 12 is connected to circuit components downstream in order to generate an RF signal for actuation of a switch initiator. These circuit components include a rectifier 31, a voltage regulator U2, an encoder 40 (preferably comprising a peripheral interface controller (PIC) chip) as well as an RF generator 50 and antenna 60. FIG. 10b shows the waveform of the electrical signal of FIG. 10a after it has been rectified. FIG. 10c shows the waveform of the rectified electrical signal of FIG. 10b after it has been regulated to a substantially uniform voltage, preferably 3.3 VDC.

Figure 22:
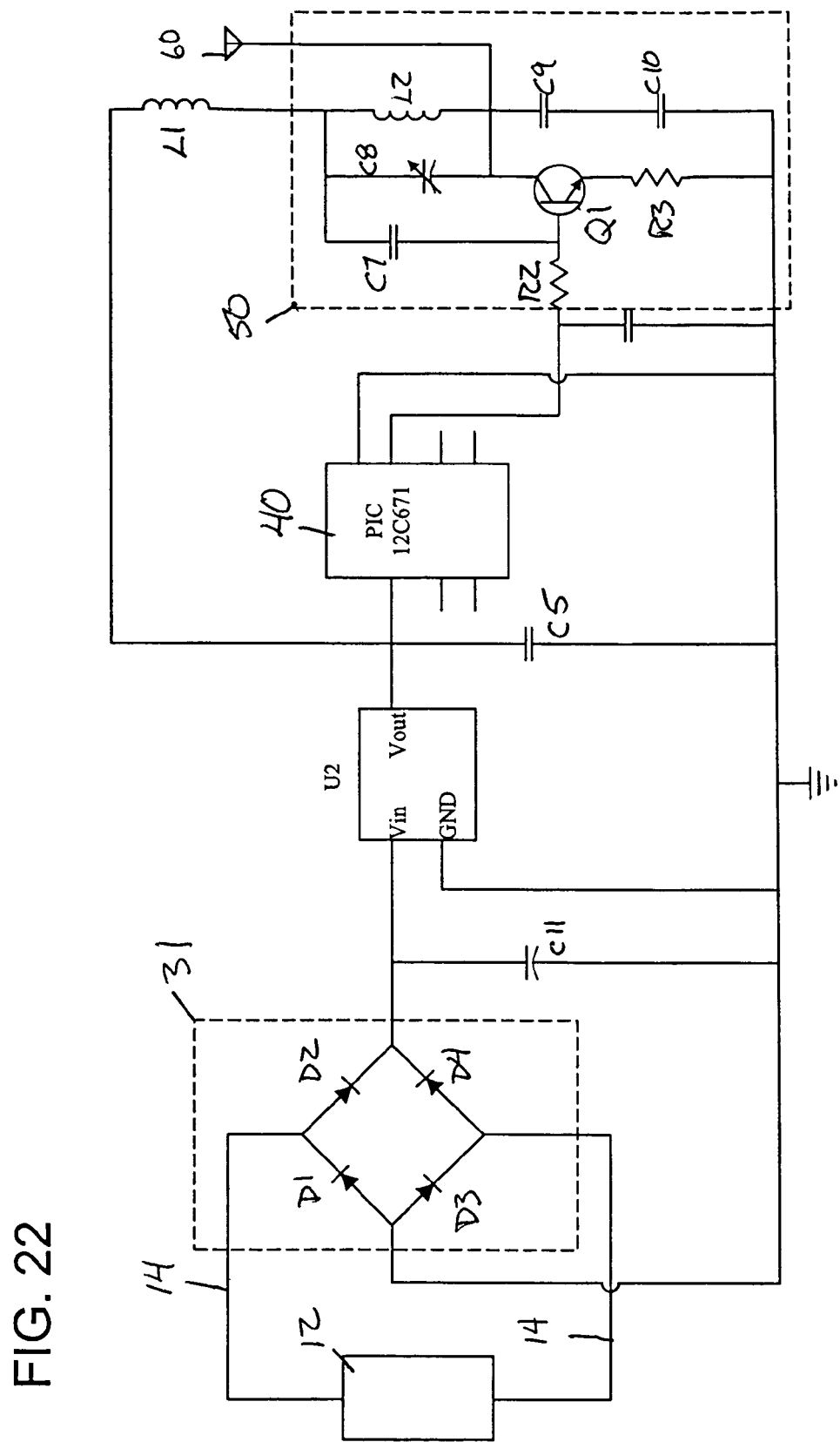
FIG. 22 is a detailed circuit diagram of the circuit in FIG. 20.

Referring now to FIG. 22: The transducer 12 is first connected to a rectifier 31. Preferably the rectifier 31 comprises a bridge rectifier 31 comprising four diodes D1, D2, D3 and D4 arranged to only allow positive voltages to pass. The first two diodes D1 and D2 are connected in series, i.e., the anode of D1 connected to the cathode of D2. The second two diodes D3 and D4 are connected in series, i.e., the anode of D3 connected to the cathode of D4. The anodes of diodes D2 and D4 are connected, and the cathodes of diodes D1 and D3 are connected, thereby forming a bridge rectifier. The rectifier is positively biased toward the D2-D4 junction and negatively biased toward the D1-D3 junction. One of the wires 14 of the transducer 12 is electrically connected between the junction of diodes D1 and D2, whereas the other wire 14 (connected to the opposite face of the transducer 12) is connected to the junction of diodes D3 and D4. The junction of diodes D1 and D3 are connected to ground. A capacitor C11 is preferably connected on one side to the D2-D4 junction and on the other side of the capacitor C11 to the D1-D3 junction in order to isolate the voltages at each side of the rectifier from each other. Therefore, any negative voltages applied to the D1-D2 junction or the D3-D4 junction will pass through diodes D1 or D3 respectively to ground. Positive voltages applied to the D1-D2 junction or the D3-D4 junction will pass through diodes D2 or D4 respectively to the D2-D4 junction. The rectified waveform is shown in FIG. 10b.

The circuit also comprises a voltage regulator U2, which controls magnitude of the input electrical signal downstream of the rectifier 31. The rectifier 31 is electrically connected to a voltage regulator U2 with the D2-D4 junction connected to the Vin pin of the voltage regulator U2 and with the D1-D3 junction connected to ground and the ground pin of the voltage regulator U2. The voltage regulator U2 comprises for example a LT1121 chip voltage regulator U2 with a 3.3 volts DC output. The output voltage waveform is shown in FIG. 10c and comprises a substantially uniform voltage signal of 3.3 volts having a duration of approximately 100-250 milliseconds, depending on the load applied to the transducer 12. The regulated waveform is shown in FIG. 10b. The output voltage signal from the voltage regulator (at the Vout pin) may then be transmitted via another conductor to the relay switch 290, in order to change the position of a relay switch 290 from one position to another. Preferably however, the output voltage is connected through an encoder 40 to an RF generation section 50 of the circuit.

Referring again to FIGS. 20 and 22: The output of the voltage regulator U2 is preferably used to power an encoder 40 or tone generator comprising a peripheral interface controller (PIC) microcontroller that generates a pulsed tone. This pulsed tone modulates an RF generator section 50 which radiates an RF signal using a tuned loop antenna 60. The signal radiated by the loop antenna is intercepted by an RF receiver 270 and a decoder 280 which generates a relay pulse to activate the relay 290.

The output of the voltage regulator U2 is connected to a PIC microcontroller, which acts as an encoder 40 for the electrical output signal of the regulator U2. More specifically, the output conductor for the output voltage signal (nominally 3.3 volts) is connected to the input pin of the programmable encoder 40. Types of register-based PIC microcontrollers include the eight-pin PIC12C5XX and PIC12C67x, baseline PIC16C5X, midrange PIC16CXX and the high-end PIC17CXX/PIC18CXX. These controllers employ a modified Harvard, RISC architecture that support various-width instruction words. The datapaths are 8 bits wide, and the instruction widths are 12 bits wide for the PIC16C5X/PIC12C5XX, 14 bits wide for the PIC12C67X/PIC16CXX, and 16 bits wide for the PIC17CXX/PIC18CXX. PICMICROS are available with one-time programmable EPROM, flash and mask ROM. The PIC17CXX/PIC18CXX support external memory. The encoder 40 comprises for example a PIC model 12C671. The PIC12C6XX products feature a 14-bit instruction set, small package footprints, low operating voltage of 2.5 volts, interrupts handling, internal oscillator, on-board EEPROM data memory and a deeper stack. The PIC12C671 is a CMOS microcontroller programmable with 35 single word instructions and contains 1024×14 words of program memory, and 128 bytes of user RAM with 10 MHz maximum speed. The PIC12C671 features an 8-level deep hardware stack, 2 digital timers (8-bit TMRO and a Watchdog timer), and a four-channel, 8-bit A/D converter.

The output of the PIC may include square, sine or saw waves or any of a variety of other programmable waveforms. Typically, the output of the encoder 40 is a series of binary square waveforms (pulses) oscillating between 0 and a positive voltage, preferably +3.3 VDC. The duration of each pulse (pulse width) is determined by the programming of the encoder 40 and the duration of the complete waveform is determined by the duration of output voltage pulse of the voltage regulator U2. A capacitor C5 is preferably be connected on one end to the output of the voltage regulator U2, and on the other end to ground to act as a filter between the voltage regulator U2 and the encoder 40.

Thus, the use of an IC as a tone generator or encoder 40 allows the encoder 40 to be programmed with a variety of values. The encoder 40 is capable of generating one of many unique encoded signals by simply varying the programming for the output of the encoder 40. More specifically, the encoder 40 can generate one of a billion or more possible codes. It is also possible and desirable to have more than one encoder 40 included in the circuit in order to generate more than one code from one transducer 12 or transmitter. Alternately, any combination of multiple transducers and multiple pulse modification subcircuits may be used together to generate a variety of unique encoded signals. Alternately the encoder 40 may comprise one or more inverters forming a series circuit with a resistor and capacitor, the output of which is a square wave having a frequency determined by the RC constant of the encoder 40.

The DC output of the voltage regulator U2 and the coded output of the encoder 40 are connected to an RF generator 50. A capacitor C6 may preferably be connected on one end to the output of the encoder 40, and on the other end to ground to act as a filter between the encoder 40 and the RF generator 50. The RF generator 50 consists of tank circuit connected to the encoder 40 and voltage regulator U2 through both a bipolar junction transistor (BJT) Q1 and an RF choke. More specifically, the tank circuit consists of a resonant circuit comprising an inductor L2 and a capacitor C8 connected to each other at each of their respective ends (in parallel). Either the capacitor C8 or the inductor L2 or both may be tunable in order to adjust the frequency of the tank circuit. An inductor L1 acts as an RF choke, with one end of the inductor L1 connected to the output of the voltage regulator U2 and the opposite end of the inductor L1 connected to a first junction of the L2-C8 tank circuit. Preferably, the RF choke inductor L1 is an inductor with a diameter of approximately 0.125 inches and turns on the order of thirty and is connected on a loop of the tank circuit inductor L2. The second and opposite junction of the L2-C8 tank circuit is connected to the collector of BJT Q1. The base of the BJT Q1 is also connected through resistor R2 to the output side of the encoder 40. A capacitor C7 is connected to the base of a BJT Q1 and to the first junction of the tank circuit. Another capacitor C9 is connected in parallel with the collector and emitter of the BJT Q1. This capacitor C9 improves the feedback characteristics of the tank circuit. The emitter of the BJT Q1 is connected through a resistor R3 to ground. The emitter of the BJT Q1 is also connected to ground through capacitor C10 which is in parallel with the resistor R3. The capacitor C10 in parallel with the resistor R3 provides a more stable conduction path from the emitter at high frequencies.

The RF generator 50 works in conjunction with a tuned loop antenna 60. In the preferred embodiment, the inductor L2 of the tank circuit serves as the loop antenna 60. More preferably, the inductor/loop antenna L2 comprises a single rectangular loop of copper wire which may have an additional smaller loop or jumper (not shown) connected to the rectangular loop L2. Adjustment of the shape and angle of the smaller loop relative to the rectangular loop L2 is used to increase or decrease the apparent diameter of the inductor L2 and thus tunes the RF transmission frequency of the RF generator 50. In an alternate embodiment, a separate tuned antenna may be connected to the second junction of the tank circuit.

In operation: The positive voltage output from the voltage regulator U2 is connected the encoder 40 and the RF choke inductor L1. The voltage drives the encoder 40 to generate a coded square wave output, which is connected to the base of the BJT Q1 through resistor R2. When the coded square wave voltage is zero, the base of the BJT Q1 remains de-energized, and current does not flow through the inductor L1. When the coded square wave voltage is positive, the base of the BJT Q1 is energized through resistor R2. With the base of the BJT Q1 energized, current is allowed to flow across the base from the collector to the emitter and current is also allowed to flow across the inductor L1. When the square wave returns to a zero voltage, the base of the BJT Q1 is again de-energized.

When current flows across the choke inductor L1, the tank circuit capacitor C8 charges. Once the tank circuit capacitor C8 is charged, the tank circuit begins to resonate at the frequency determined by the circuit's LC constant. For example, a tank circuit having a 7 picofarad capacitor and an inductor L2 having a single rectangular loop measuring 0.7 inch by 0.3 inch, the resonant frequency of the tank circuit is 310 MHz. The choke inductor L1 prevents RF leakage into upstream components of the circuit (the PIC) because changing the magnetic field of the choke inductor L1 produces an electric field opposing upstream current flow from the tank circuit. To produce an RF signal, charges have to oscillate with frequencies in the RF range. Thus, the charges oscillating in the tank circuit inductor/tuned loop antenna L2 produce an RF signal of preferably 310 MHz. As the square wave output of the inverter turns the BJT Q1 on and off, the signal generated from the loop antenna 60 comprises a pulsed RF signal having a duration of 100-250 milliseconds and a pulse width determined by the encoder 40, (typically of the order of 0.1 to 5.0 milliseconds thus producing 20 to 2500 pulses at an RF frequency of approximately 310 MHz. The RF generator section 50 is tunable to multiple frequencies. Therefore, not only is the transmitter capable of a great number of unique codes, it is also capable of generating each of these codes at a different frequency, which greatly increases the number of possible combinations of unique frequency-code signals.

The RF generator 50 and antenna 60 work in conjunction with an RF receiver 270. More specifically, an RF receiver 270 in proximity to the RF transmitter 126 (within 300 feet) can receive the pulsed RF signal transmitted by the RF generator 50. The RF receiver 270 comprises a receiving antenna 270 for intercepting the pulsed RF signal (tone). The tone generates a pulsed electrical signal in the receiving antenna 270 that is input to a microprocessor chip that acts as a decoder 280. The decoder 280 filters out all signals except for the RF signal it is programmed to receive, e.g., the signal generated by the RF generator 50. An external power source is also connected to the microprocessor chip/decoder 280. In response to the intercepted tone from the RF generator 50, the decoder chip produces a pulsed electrical signal. The external power source connected to the decoder 280 augments the pulsed voltage output signal developed by the chip. This augmented (e.g., 120 VAC) voltage pulse is then applied to a conventional relay 290 for changing the position of a switch within the relay. Changing the relay switch position is then used to turn an electrical device with a bipolar switch on or off, or toggle between the several positions of a multiple position switch. Zero voltage switching elements may be added to ensure the relay 290 activates only once for each depression and recovery cycle of the flextensional transducer element 12.

Switch Initiator System with Trainable Receiver

Several different RF transmitters may be used that generate different tones for controlling relays that are tuned to receive that tone. In another embodiment, digitized RF signals may be coded and programmable (as with a garage door opener) to only activate a relay that is coded with that digitized RF signal. In other words, the RF transmitter is capable of generating at least one tone, but is preferably capable of generating multiple tones. Most preferably, each transmitter is programmed with one or more unique coded signals. This is easily done, since programmable ICs for generating the tone can have over $2^{30}$ possible unique signal codes which is the equivalent of over 1 billion codes. Most preferably the invention comprises a system of multiple transmitters and one or more receivers for actuating building lights, appliances, security systems and the like. In this system for remote control of these devices, an extremely large number of codes are available for the transmitters for operating the lights, appliances and/or systems and each transmitter has at least one unique, permanent and nonuser changeable code. The receiver and controller module at the lights, appliances and/or systems is capable of storing and remembering a number of different codes corresponding to different transmitters such that the controller can be programmed so as to actuated by more than one transmitted code, thus allowing two or more transmitters to actuate the same light, appliance and/or system.

The remote control system includes a receiver/controller for learning a unique code of a remote transmitter to cause the performance of a function associated with the system, light or appliance with which the receiver/controller module is associated. The remote control system is advantageously used, in one embodiment, for interior or exterior lighting, household appliances or security system. Preferably, a plurality of transmitters is provided wherein each transmitter has at least one unique and permanent non-user changeable code and wherein the receiver can be placed into a program mode wherein it will receive and store two or more codes corresponding to two or more different transmitters. The number of codes which can be stored in transmitters can be extremely high as, for example, greater than one billion codes. The receiver has a decoder module therein which is capable of learning many different transmitted codes, which eliminates code switches in the receiver and also provides for multiple transmitters for actuating the light or appliance. Thus, the invention makes it possible to eliminate the requirements for code selection switches in the transmitters and receivers.

Figure 20:
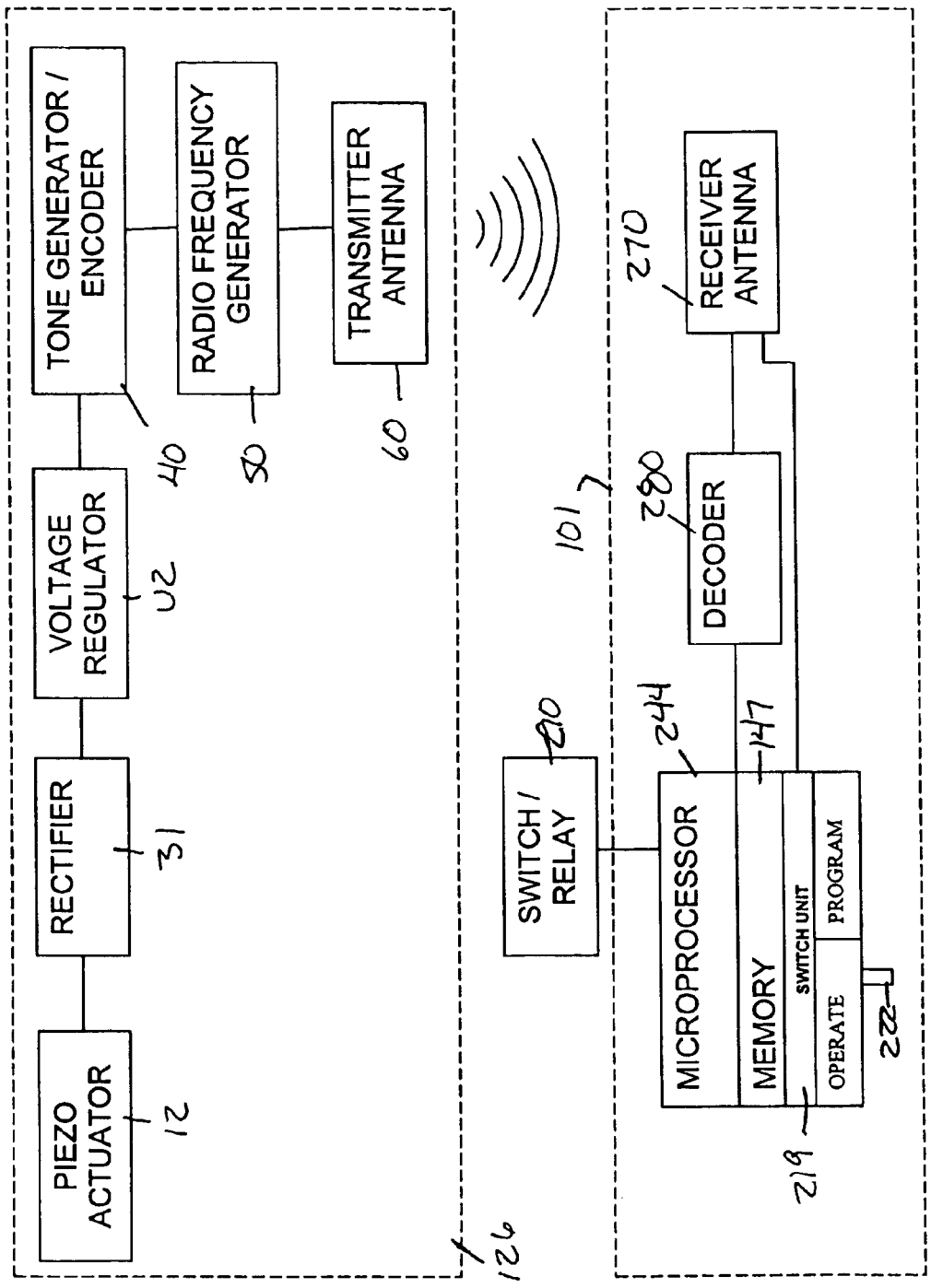
FIG. 20 is a block diagram showing the components of a circuit for using the electrical signal generated by the device of FIGS. 6-8, and 11-19.
Figure 21:
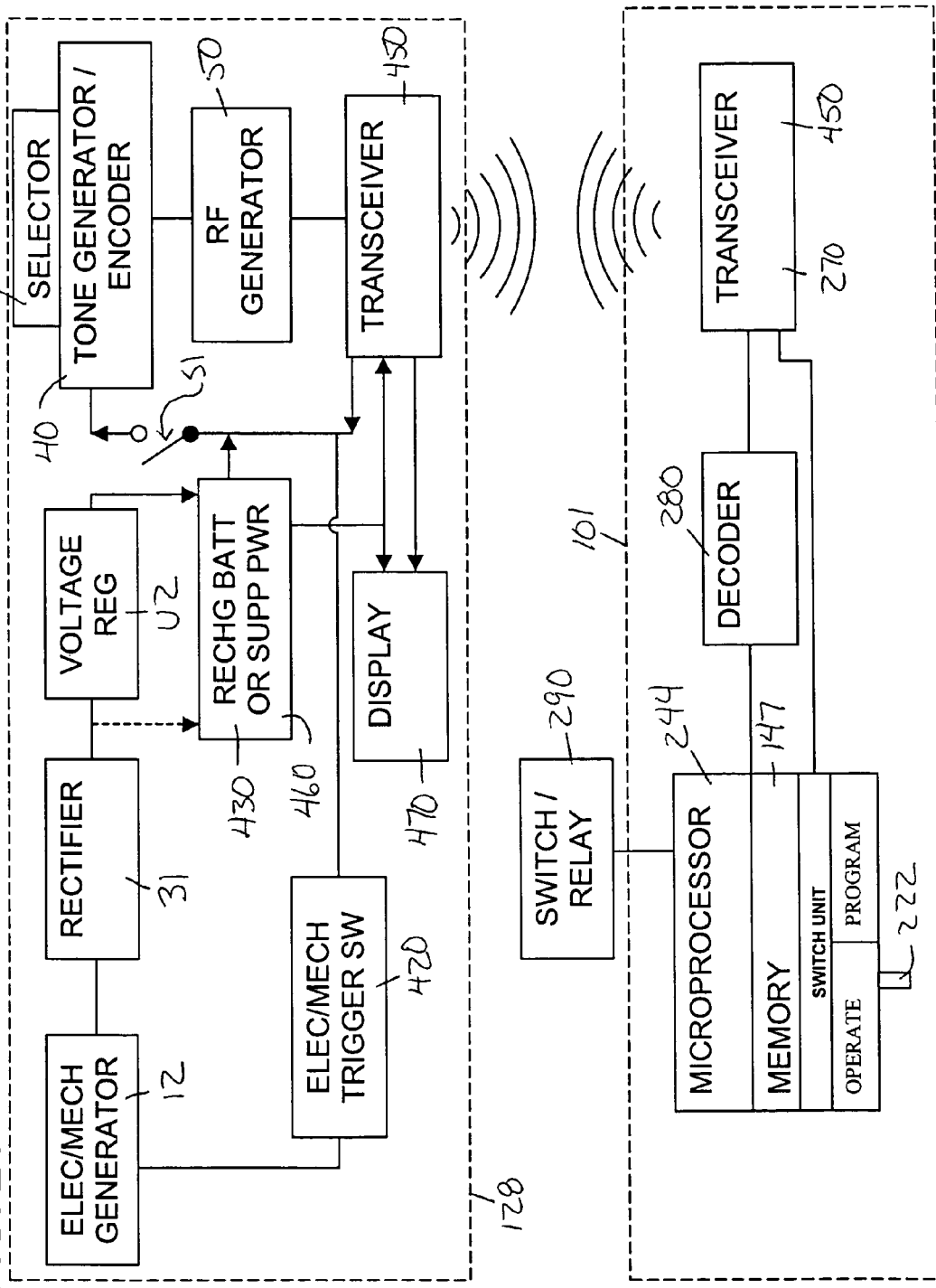
FIG. 21 is a block diagram showing the components of an alternate circuit for using the electrical signal generated by the device of FIGS. 6-8, and 11-19.

Referring to FIGS. 20-21: The receiver module 101 includes a suitable antenna 270 for receiving radio frequency transmissions from one or more transmitters 126 and 128 and supplies an input to a decoder 280 which provides an output to a microprocessor unit 244. The microprocessor unit 244 is connected to a relay device 290 or controller which switches the light or appliance between one of two or more operation modes, i.e., on, off, dim, speed control, heat, cool or some other mode of operation. A switch 222 is mounted on a switch unit 219 connected to the receiver and also to the microprocessor 244. The switch 222 is a two position switch that can be moved between the "operate" and "program" positions to establish operate and program modes.

In the invention, each transmitter, such as transmitters 126 and 128, has at least one unique code which is determined by the tone generator/encoder 40 contained in the transmitter. The receiver unit 101 is able to memorize and store a number of different transmitter codes which eliminates the need of coding switches in either the transmitter or receiver which are used in the prior art. This also eliminates the requirement that the user match the transmitter and receiver code switches. Preferably, the receiver 101 is capable of receiving many transmitted codes, up to the available amount of memory locations 147 in the microprocessor 144, for example one hundred or more codes.

When the controller 290 for the light or appliance is initially installed, the switch 222 is moved to the program mode and the first transmitter 126 is energized so that the unique code of the transmitter 126 is transmitted. This is received by the receiver module 101 having an antenna 270 and decoded by the decoder 280 and supplied to the microprocessor unit 244. The code of the transmitter 126 is then supplied to the memory address storage 247 and stored therein. Then if the switch 222 is moved to the operate mode and the transmitter 126 energized, the receiver 270, decoder 280 and the microprocessor 244 will compare the received code with the code of the transmitter 126 stored in the first memory location in the memory address storage 247 and since the stored memory address for the transmitter 126 coincides with the transmitted code of the transmitter 126 the microprocessor 244 will energize the controller mechanism 290 for the light or appliance to energize de-energize or otherwise operate the device.

In order to store the code of the second transmitter 128 the switch 222 is moved again to the program mode and the transmitter 128 is energized. This causes the receiver 270 and decoder 280 to decode the transmitted signal and supply it to the microprocessor 244 which then supplies the coded signal of the transmitter 128 to the memory address storage 147 where it is stored in a second address storage location. Then the switch 222 is moved to the operate position and when either of the transmitters 126 and 128 are energized, the receiver 270 decoder 280 and microprocessor 244 will energize the controller mechanism 290 for the light or appliance to energize de-energize or otherwise operate the device. Alternately, the signal from the first transmitter 126 and second transmitter 128 may cause separate and distinct actions to be performed by the controller mechanism 290.

Thus, the codes of the transmitters 126 and 128 are transmitted and stored in the memory address storage 247 during the program mode after which the system, light or appliance controller 290 will respond to either or both of the transmitters 126 and 128. Any desired number of transmitters can be programmed to operate the system, light or appliance up to the available memory locations in the memory address storage 247.

This invention eliminates the requirement that binary switches be set in the transmitter or receiver as is done in systems of the prior art. The invention also allows a controller to respond to a number of different transmitters because the specific codes of a number of the transmitters are stored and retained in the memory address storage 247 of the receiver module 101.

In yet another more specific embodiment of the invention, each transmitter 126 or 128 contains two or more unique codes for controlling a system, light or appliance. One code corresponds in the microprocessor to the "on" position and another code corresponds in the microprocessor 244 to the "off" position of the controller 290. Alternately, the codes may correspond to "more" or "less" respectively in order to raise or lower the volume of a sound device or to dim or undim lighting for example. Lastly, the unique codes in a transmitter 126 or 128 may comprise four codes which the microprocessor interprets as "on", "off", "more" and "less" positions of the controller 290, depending on the desired setup of the switches. Alternatively, a transmitter 126 or 128 may only have two codes, but the microprocessor 244 interprets repeated pushes of "on" or "off" signals respectively to be interpreted as dim up and dim down respectively.

Figure 26:
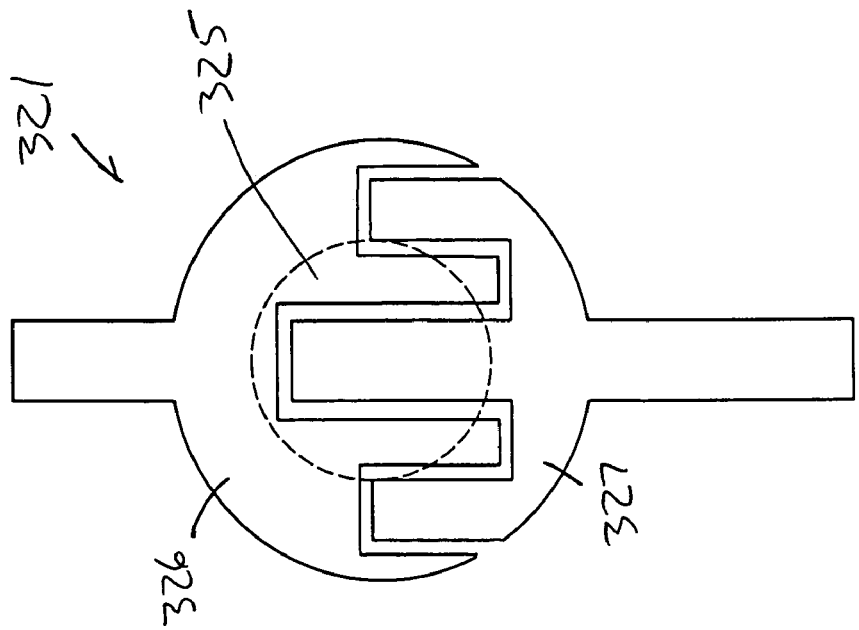
FIG. 26 is a plan view of a domed contact switch showing disconnected concentric circuit traces, with the domed contact in ghost thereabove.
Figure 27:
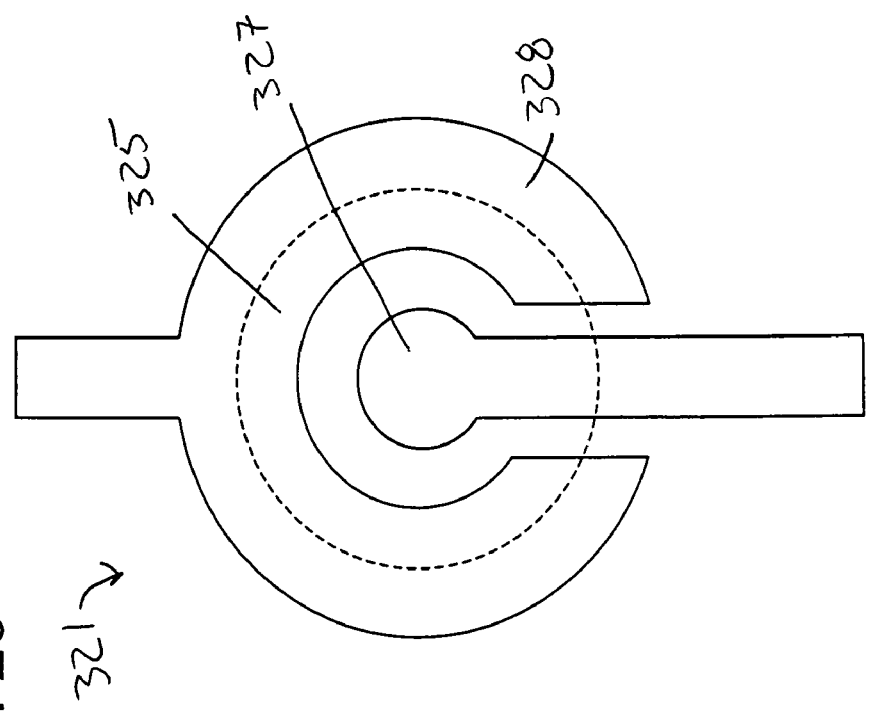
FIG. 27 is a plan view of a contact switch showing disconnected interdigitated circuit traces, with the shorting contact in ghost thereabove.

Referring to FIGS. 25 and 12-14: The encoder 40 may further be programmable to generate a different code, dependent upon which of the multiple input connections is energized. The DC output of the voltage regulator U2 and the coded output of the encoder are connected to an RF generator 50 via one or more membrane switches 321, 322 on the faceplate/deflector 72. The design and construction of two different membrane switches is shown in FIGS. 26-27. When a membrane switch 321, 322 is pressed, it creates electrical contact between the output of the voltage regulator U2 and one of the input pins to the PIC encoder 40. The encoder 40 output signal (code) is dependent upon which input pin has the voltage applied thereto. That is to say, the output signal or code is dependent upon and different for each pin energized by the respective membrane switch that is pressed/closed. For example, when the mechanical deflector is pressed (but not a membrane switch 321 or 322), the encoder is energized and sends a default code to the RF transmitter. However, when a membrane switch 321 depressed, it creates electrical contact from the voltage regulator U2 to a different pin of the encoder 40, thus changing the output of the encoder to a different code from the default code. Likewise, when a different witch 322 depressed, it creates electrical contact from the voltage regulator U2 to a yet another pin of the encoder 40, thus changing the output of the encoder to a third different code from the default code and second codes. These codes can correspond to a variety of functions for electrical appliances that receive the transmitted code such as a light switch, a dimmer, an electrical appliance power source, a security system, a motor controller, a solenoid, a piezoelectric transducer and a latching pin for a locking system. Exemplary functions that are associated with the membrane switches and concomitant coded outputs of the encoder 40 include "TOGGLE"", "ON", "OFF", "DIM", "UNDIM/BRIGHTEN", "LOCK", "UNLOCK", "SPEED UP", "SLOW DOWN", "TEMPERATURE UP", "TEMPERATURE DOWN", "ACTIVATE", "RESET" or the like command functions for electrical appliances connected to the receiver.

Basic membrane switch contact designs are shown without an over layer in FIGS. 17 and 18. The shorting contact 325 of FIG. 18 on the right is normally attached to a resilient material that holds it off the surface of the interdigitated fingers 326 and 327 when it is not pressed down. The shorting contact 325 of FIG. 17 is a metallic dome situated above concentric electrical traces 328 and 329, and when the dome 325 is pressed contacts at least the outer circular trace 328, and when fully depressed contacts bother the inner 329 and outer 328 traces.

The contact area design is another important and interesting element of a membrane switch. Contact finish can vary. Gold, nickel, silver and even graphite have been used. The layout will vary with the type of contact used. For example, for a shorting contact, interdigitated fingers are often used. However, when a metal dome contact is employed, a central contact with a surrounding ring is frequently seen.

In another embodiment of the invention, receiver modules 101 may be trained to accept the transmitter code(s) in one-step. Basically, the memory 147 in the microprocessor 244 of the receiver modules 101 will have "slots" where codes can be stored. For instance one slot may be for all of the codes that the memory 147 accepts to be turned on, another slot for all the off codes, another all the 30% dimmed codes, etc.

Each transmitter 126 has a certain set of codes. For example one transmitter may have just one code, a "toggle" code, wherein the receiver module 101 knows only to reverse its current state, if it's on, turn off, and if it's off, turn on. Alternatively, a transmitter 126 may have many codes for the complex control of appliances. Each of these codes is "unique". The transmitter 126 sends out its code set in a way in which the receiver 101 knows in which slots to put each code. Also, with the increased and longer electrical signal that can be generated in the transmitter 126, a single transmission of a code set is achievable even with mechanically produced voltage. As a back-up, if this is not true, and if wireless transmission uses up more electricity than we have available, some sort of temporary wired connection (upper not shown) between each transmitter and receiver target is possible. Although the disclosed embodiment shows manual or mechanical interaction with the transmitter and receiver to train the receiver, it is yet desirable to put the receiver in reprogram mode with a wireless transmission, for example a "training" code.

In yet another embodiment of the invention, the transmitter 126 may have multiple unique codes and the transmitter randomly selects one of the multitude of possible codes, all of which are programmed into the memory allocation spaces 147 of the microprocessor 244. Furthermore, the transmitter 126 may have multiple selectable codes. As mentioned above two or more codes may be selected using one or more membrane switches 321, 322. In a system with more than one code and preferably 2-60 codes a separate selector switch 45 may be used, as shown in FIGS. 21-24. A selector switch 45 is preferably mechanically connected to the input of the encoder 40. By changing the position of the selector 45, the input to the encoder 40 is changed, thereby changing the output code of the encoder 40 to correspond to the position of the selector switch 45. The selector 45 may comprise a multi-position relay, a slider switch or a dial, such as is used in thermostats. In an exemplary operation, the selector 45 may be set to 75 degrees and the deflector 72 is then depressed. The encoder 40 then modulates a code onto the RF generator 50 corresponding to "CHANGE TEMPERATURE TO 75 DEGREES" which is received the by the receiver module 101. The receiver module then changes the position of the relay(s) at the heating/cooling appliance to change the temperature to 75 degrees. As described further hereinbelow, the receiver module 101 may transmit through a transceiver 450 a feedback or confirmation signal indicating that the desired temperature has been set or achieved.

In yet another embodiment of the invention, the transmitter 126 signal need not be manually operated or triggered, but may as easily be operated by any manner of mechanical force, i.e., the movement of a window, door, safe, foot sensor, etc. and that a burglar alarm sensor might simultaneously send a signal to the security system and a light in the intruded upon room. Likewise, the transmitter 126 may be combined with other apparatus. For example, a transmitter 126 may be located within a garage door opener which can also turn on one or more lights in the house, when the garage door opens.

Furthermore, the transmitters can talk to a central system or repeater which re-transmits the signals by wire or wireless means to lights and appliances. In this manner, one can have one transmitter/receiver set, or many transmitters interacting with many different receivers, some transmitters talking to one or more receivers and some receivers being controlled by one or more transmitters, thus providing a broad system of interacting systems and wireless transmitters. Also, the transmitters and receivers may have the capacity of interfacing with wired communications like SMARTHOME or BLUETOOTH, and ZIGBEE.

It is seen that the present invention allows a receiving system to respond to one of a plurality of transmitters which have different unique codes which can be stored in the receiver during a program mode. Each time the "program mode switch" 222 is moved to the program position, a different storage can be connected so that the new transmitter code would be stored in that address. After all of the address storage capacity have been used additional codes would erase all old codes in the memory address storage before storing a new one.

This invention is safe because it eliminates the need for 120 VAC (220 VAC in Europe) lines to be run to each switch in the house. Instead the higher voltage overhead AC lines are only run to the appliances or lights, and they are actuated through the self-powered switching device and relay switch. The invention also saves on initial and renovation construction costs associated with cutting holes and running the electrical lines to/through each switch and within the walls. The invention is particularly useful in historic structures undergoing preservation, as the walls of the structure need not be destroyed and then rebuilt. The invention is also useful in concrete construction, such as structures using concrete slab and/or stucco construction and eliminate the need to have wiring on the surface of the walls and floors of these structures. Furthermore, remote transmitters may be fitted with hole and screws to mount over existing switch boxes in walls, or be mounted over the existing switch boxes, using adhesives, magnetic mounting, screws, bolts, hook and loop, snaps, hooks, or other fasteners.

Figure 23:
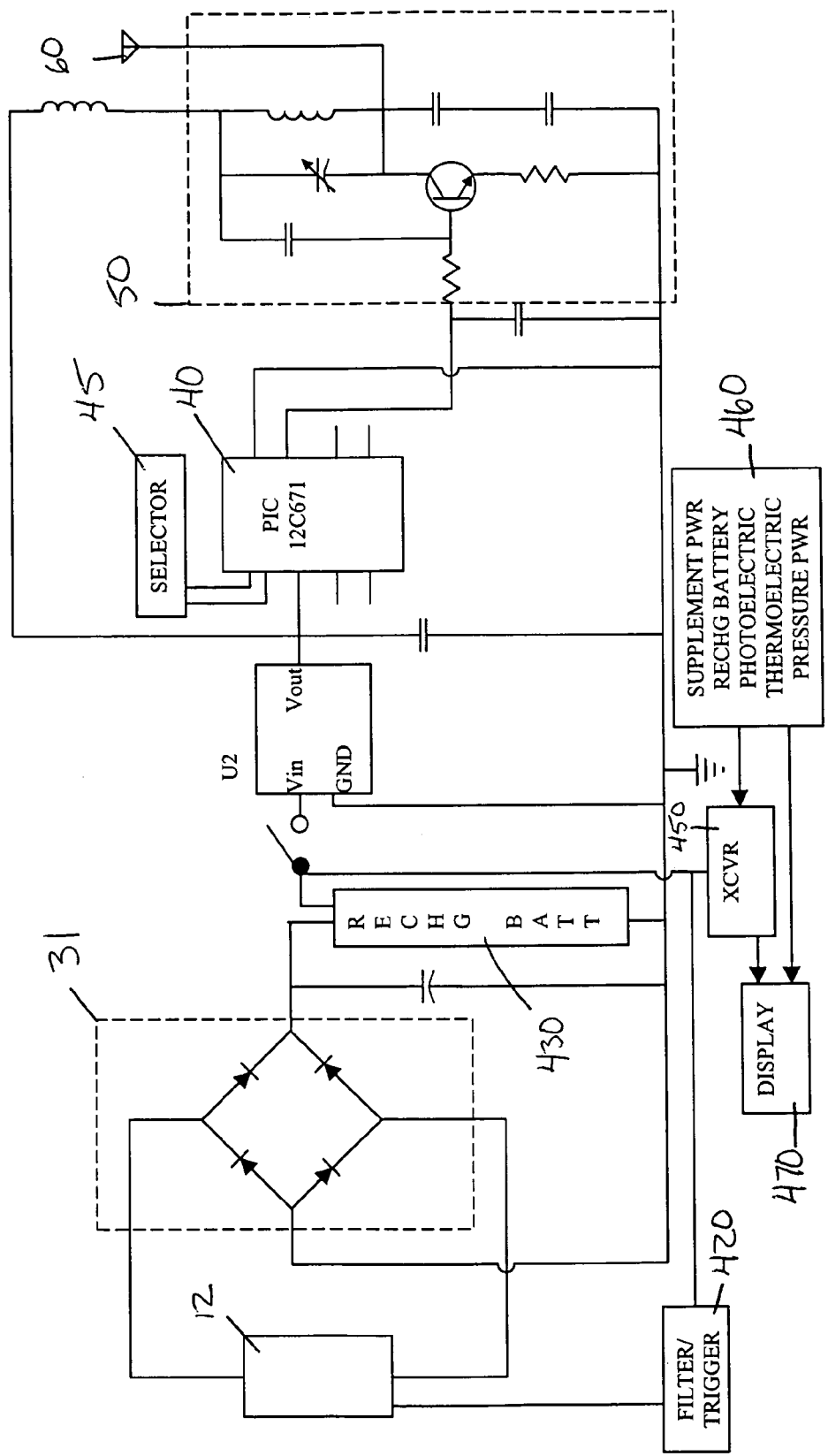
FIG. 23 is a detailed circuit diagram of the circuit in FIG. 21.
Figure 24:
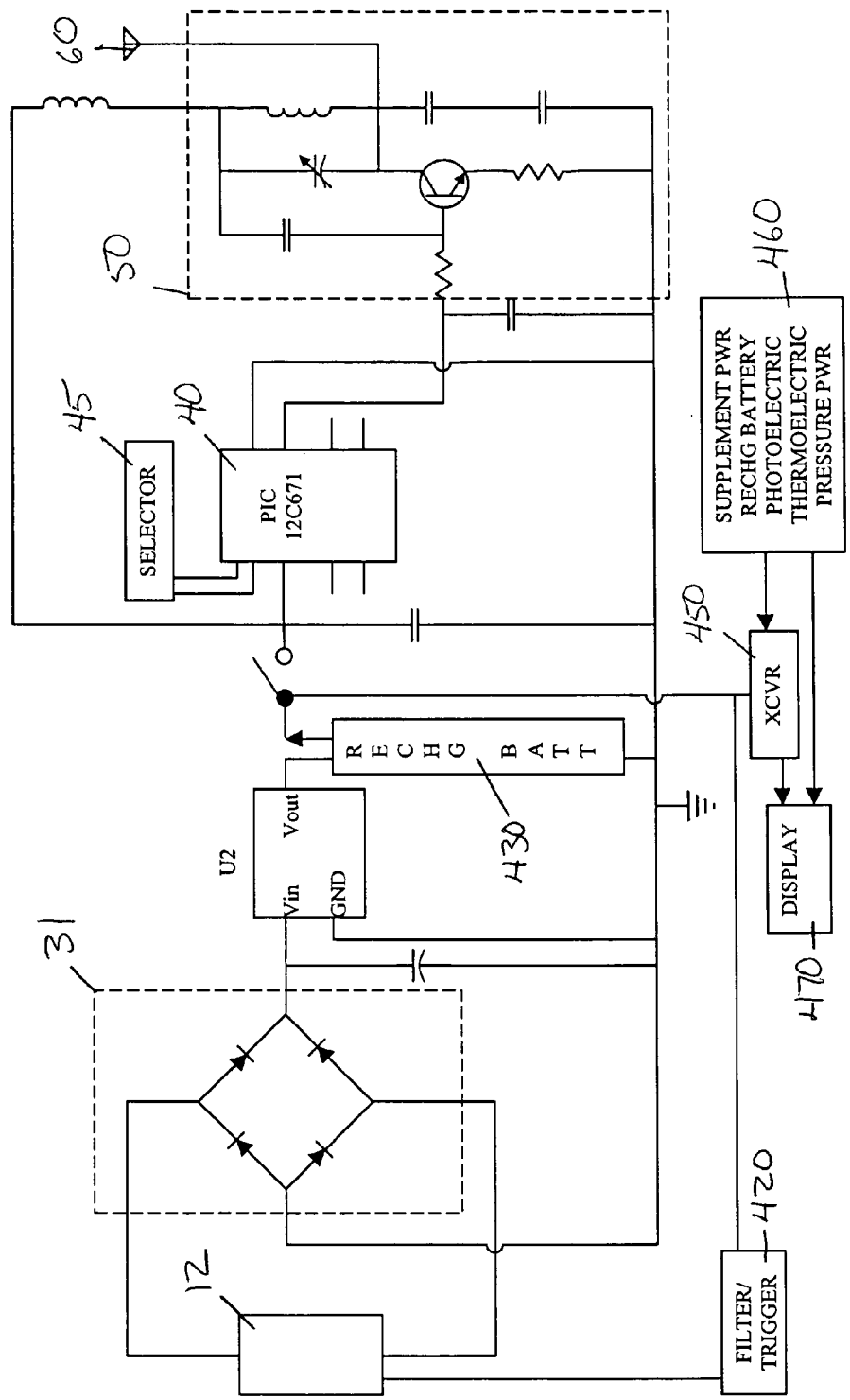
FIG. 24 is a detailed circuit diagram of an alternate circuit in FIG. 21.
Figure 25:
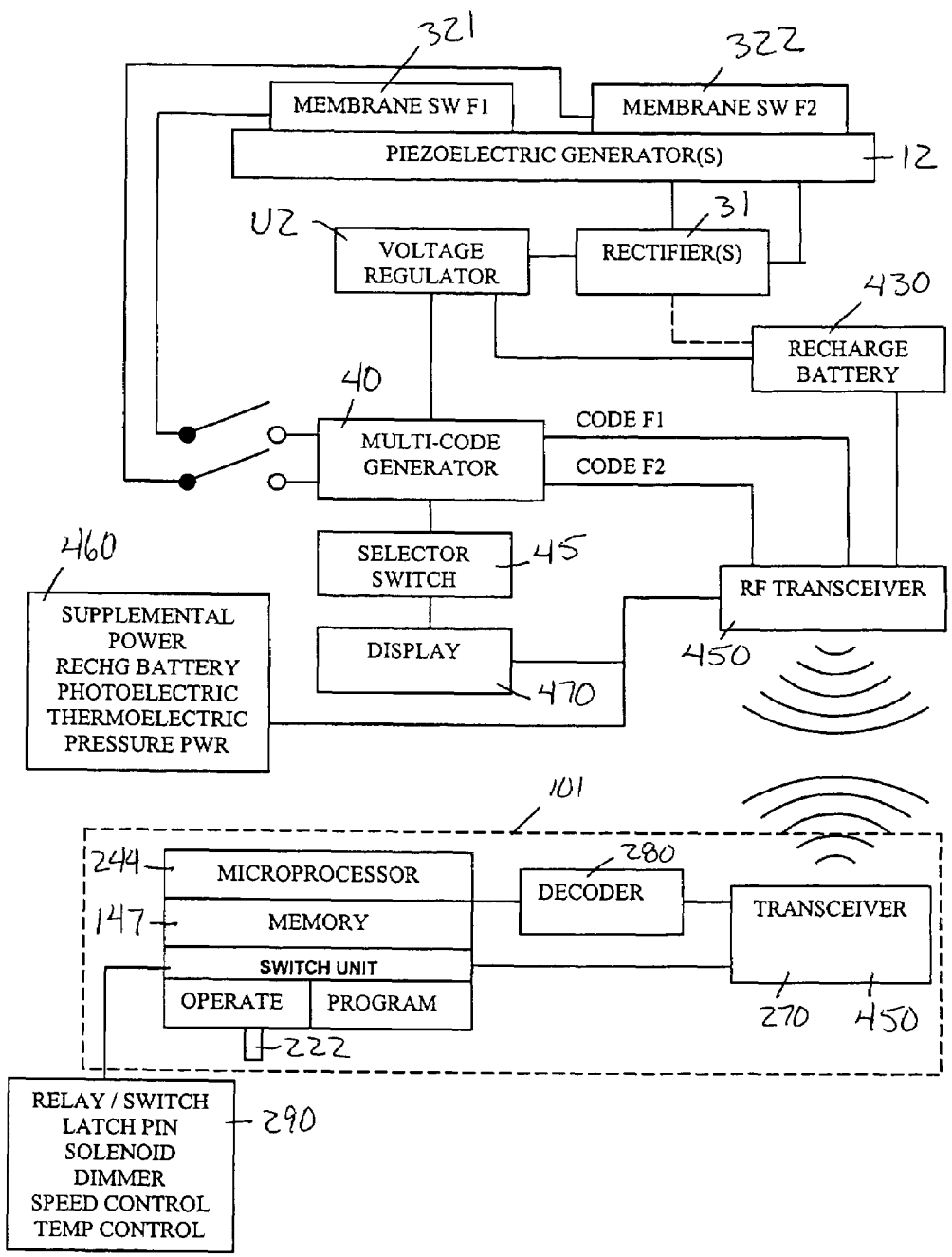
FIG. 25 is a block diagram showing the components of an alternate circuit for using the electrical signal generated by the device of FIGS. 6-8 and 13a-b and incorporating membrane switches for multiple functions.

Referring now to FIGS. 21 and 23-24: While in the preferred embodiment of the invention, the actuation means has been described as from mechanical to electric, it is within the scope of the invention to include a supplemental power source, such as batteries 430 in the transmitter to power or supplement the power of the transmitter. For example, long life rechargeable batteries 430 may be included in the transmitter circuitry and may be recharged through the electromechanical transducers 12. These rechargeable batteries 430 may thus provide backup power to the transmitter 50. The circuits illustrated in the figures are the same as those described herein above, with the exception of the addition of rechargeable batteries 430 in the circuit. In the circuit of FIGS. 21 and 23, the ground terminal of the battery is connected to ground and the positive terminal is connected to the output side of the rectifier before the voltage regulator. In the preferred circuit of FIGS. 21 and 24, the ground terminal of the battery is connected to ground and the positive terminal is connected to the output side of the voltage regulator U2 before the transmitter subcircuit 50. Power may be supplemented to the transmitter/transceiver using other supplemental powers sources 460 such as solar or light power, e.g., by photoelectric cells used in some calculators), by changes in temperature (thermoelectric), or by changes in pressure.

Referring now to FIGS. 21 and 24: The circuit of FIG. 21 includes a rechargeable battery as in the circuit of FIG. 24. However, in this circuit, the output of the voltage regulator U2 is connected only to the positive/charging terminal of the rechargeable battery 430, i.e., the voltage regulator U2 output is not connected directly to the input side of the transmitter subcircuit 50. The output of the rechargeable battery 430 is connected to the input side of the transmitter subcircuit through a switch S1. The switch S1 may comprise a transistor. When the switch S1 is closed/energized, electrical power is applied to the transmitter subcircuit. The switch may be energized when the deflection means activates the transducer 12. When the transducer 12 is deflected, an electrical output is produced, most of which is rectified and regulated, and then used of charge the battery 30. A small amount of the electrical power is tapped by a filter/trigger 420 from the transducer 12 (using for example a BJT connected between a grounded resistor and a second resistor between the BJT and the transducer 12), which electrical energy is applied to the switching device in order to electrically connected the battery to the transmitter subcircuit.

Referring again to FIGS. 21 and 23-24: In another embodiment of a self-powered transmitter circuit, the rechargeable battery 430 or supplemental power source 460 not only provides power for transmission of a coded signal, but also provides power to a low power consumption receiver 450. In the preferred embodiment, the receiver/transmitter comprises a single transceiver 450. The transceiver 450 is electrically connected to the battery as in FIGS. 21 and 23-25. However, in addition to the transmitter/transceiver 450 transmitting in response to a trigger signal from the transducer 12 that energizes the switch S1, the transceiver 450 will also transmit in response to the reception by the receiver portion of the transceiver 450 reception of an RF signal.

In the preferred embodiment of the transceiver based circuit, when the transceiver 450 receives a coded signal corresponding one or more codes stored in the transmitter PIC (i.e., a polling code, a verification code, an on/off code, a feedback code), then the transmitter portion of the transceiver 450 will transmit its coded RF signal. The transmitter RF code signal may correspond for example, to a transmission code of its current state, for use as an error detection code or a verification code or as a supplement to one or more of these codes. The code transmitted by the transceiver in response to a received code may be forwarded to a central system such as a microprocessor that can display the status of multiple transceiver systems, for example in a security system.

The output of the transceiver may also be connected directly to a display 470 at the transceiver 450. The display 470 may comprise for example a low power consumption display such as an LED or LCD display capable of showing alphanumeric characters and/or colors, such as green for "ON" and red or black for "OFF". The display 470 for example may show the code or command function last transmitted by the transceiver 450, as well as receipt of a confirmation signal from the transceiver 270, 450 in the receiver module 101. This is useful for example in a wireless thermostat systems, wherein the transmitter 126 transmits a temperature signal to a receiver 101, and the receiver module 101 sends a confirmation signal to the transceiver indicating receipt of the signal and or completion of setting the temperature to the level indicated in the signal. The display is powered either through the batteries 430 or the supplemental power source 460, and most preferably by a solar/light power source 460. The battery supplemented transceivers 450 are preferably made compatible with present low-cost, very low power consumption, two-way, digital wireless communications standards such as ZIGBEE and BLUETOOTH. The transceivers and/or display may also be supplemented by not only batteries, but also the aforementioned photoelectric, thermoelectric or pressure-induced electrical power supplies.

While the above description contains many specificities, these should not be construed as limitations on the scope of the invention, but rather as an exemplification of one preferred embodiment thereof. Many other variations are possible, for example:

In addition to piezoelectric devices, the electroactive elements may comprise magnetostrictive or ferroelectric devices;

Rather than being arcuate in shape, the transducer 12 may normally be flat and still be deformable;

Multiple high deformation piezoelectric transducers may be placed, stacked and/or bonded on top of each other, as well as transducers having multiple layers on a single substrate;

Multiple piezoelectric transducers may be placed adjacent each other to form an array;

Larger, multilayer and different shapes of THUNDER elements may also be used to generate higher impulses;

The piezoelectric elements may be flextensional transducers; direct mode piezoelectric transducers, and indirect mode piezoelectric transducers;

A bearing material may be disposed between the transducers and the recesses or switch plate in order to reduce friction and wearing of one element against the next or against the frame member of the switch plate;

Other means for applying pressure to the transducer may be used including simple application of manual pressure, rollers, pressure plates, toggles, hinges, knobs, sliders, twisting mechanisms, release latches, spring loaded devices, foot pedals, game consoles, traffic activation and seat activated devices.

We claim:

1. A self-powered switching system, comprising:
   an electroactive transducer having first and second ends, said electroactive transducer comprising;
      a first electroactive member having opposing first and second electroded major faces and first and second ends;
      a flexible substrate bonded to said second major face of said first electroactive member;
         said flexible substrate having first and second ends adjacent said first and second ends of said first electroactive member;
      wherein said electroactive transducer is adapted to deform from a first position to a second position upon application of a force to said electroactive transducer;
      and wherein said electroactive transducer is adapted to return to said first position from said second position upon release of said force from said electroactive transducer;
      and wherein upon said deformation from said first position to second position, said electroactive transducer is adapted to generate a first voltage potential between said first electroded major face and said second electroded major face;
      and wherein upon said return from said first position to second position, said electroactive transducer is adapted to generate a second voltage potential between said first electroded major face and said second electroded major face;
   a mounting member for retaining said first end, said second end or said first and second ends of said electroactive transducer;
      said mounting member comprising at least one retaining means adjacent said first end, said second end or said first and second ends of said flexible substrate of said first electroactive member;
   mechanical deflection means for application of a force to said electroactive transducer, said mechanical deflection means being adapted to apply a force sufficient to deform said electroactive transducer from said first position to said second position, thereby generating a first voltage potential;
   a first conductor electrically connected to said first electroded major face of said first electroactive member;
   a second conductor electrically connected to said second electroded major face of said first electroactive member;
   a rectifier having an input side and an output side;
      said input side of said rectifier being electrically connected between said first and second conductors in parallel with said first and second electroded major faces of said electroactive transducer;
   a voltage regulator having an input side and an output side;
      said input side of said voltage regulator being electrically connected to said output side of said rectifier;
   an encoder having an input and an output side, said output side of said voltage regulator being connected to said input side of said encoder;
      said encoder being adapted to generate a coded waveform;
      an output signal at said output side of said encoder being an electrical signal having said coded waveform;
   first signal transmission means electrically connected to said output side of said encoder;
      said first signal transmission means comprising a first radio frequency generator subcircuit connected to an antenna;
      said radio-frequency generator subcircuit being adapted to generate a first radio-frequency signal modulated by said output signal of said encoder for transmission by said antenna;
   signal reception means for receiving a first signal transmitted by said first signal transmission means;
      said signal reception means being adapted to generate a relay signal in response to said first signal transmitted by said first signal transmission means; and
   a relay device for operating an electrical appliance;
      said relay device being in communication with said signal reception means;
      said relay device having a plurality of positions, each of said positions in said plurality of positions corresponding to an operating mode of said electrical appliance;
      said relay device being adapted to change between a first position to a second position in said plurality of positions in response to said relay signal.

2. The self-powered switching system of claim 1:
wherein said encoder is adapted to be programmable to generate a coded waveform, said coded waveform being selectable from at least 16-bit combinations of binary codes.

3. The self-powered switching system of claim 2:
wherein said coded waveform is programmed into said encoder during initial manufacture of said self powered switching system.

4. The self-powered switching system of claim 2:
wherein said coded waveform is not changeable by a user of said self powered switching system after initial manufacture of said self powered switching system.

5. The self-powered switching system of claim 1:
wherein said coded waveform programmed into said encoder corresponds to an operating mode of said electrical appliance.

6. The self-powered switching system of claim 2:
wherein said coded waveform programmed into said encoder is unique to that encoder.

* * * * *